(12) United States Patent
Ikeda et al.

(10) Patent No.: US 11,004,528 B2
(45) Date of Patent: May 11, 2021

(54) ELECTRONIC DEVICE

(71) Applicant: Semiconductor Energy Laboratory Co., Ltd., Kanagawa-ken (JP)

(72) Inventors: Takayuki Ikeda, Kanagawa (JP); Yoshiyuki Kurokawa, Kanagawa (JP)

(73) Assignee: Semiconductor Energy Laboratory Co., Ltd.

(*) Notice: Subject to any disclaimer, the term of this patent is extended or adjusted under 35 U.S.C. 154(b) by 0 days.

(21) Appl. No.: 16/786,038

(22) Filed: Feb. 10, 2020

(65) Prior Publication Data

US 2020/0176069 A1 Jun. 4, 2020

Related U.S. Application Data

(63) Continuation of application No. 16/199,603, filed on Nov. 26, 2018, now Pat. No. 10,699,794, which is a (Continued)

(30) Foreign Application Priority Data

May 21, 2015 (JP) ................... 2015-103331

(51) Int. Cl.
*G11C 27/02* (2006.01)
*G06N 3/063* (2006.01)
(Continued)

(52) U.S. Cl.
CPC ......... *G11C 27/024* (2013.01); *G06N 3/0635* (2013.01); *H01L 27/1225* (2013.01);
(Continued)

(58) Field of Classification Search
CPC .................................................. G11C 27/024
See application file for complete search history.

(56) References Cited

U.S. PATENT DOCUMENTS 4,962,342 A * 10/1990 Mead ..................... G06N 3/063
706/33
5,047,655 A 9/1991 Chambost et al.
(Continued)

FOREIGN PATENT DOCUMENTS

EP 1 076 309 A1 7/2000
JP 05-012466 A 1/1993
(Continued)

OTHER PUBLICATIONS

Aslam-Siddiqi, A. et al., "A 16 ×16 Nonvolatile Programmable Analog Vector-Matrix Multiplier," IEEE Journal of Solid-State Circuits, Oct. 1, 1998, vol. 33, No. 10, pp. 1502-1509.
(Continued)

*Primary Examiner* — Douglas King
(74) *Attorney, Agent, or Firm* — Husch Blackwell LLP

(57) ABSTRACT

An electronic device applicable to an artificial neuron network. The electronic device includes a first circuit, a second circuit, and first to sixth wirings. The first circuit includes a first transistor, a second transistor, and a capacitor. The second circuit includes a third transistor. A gate of the third transistor is electrically connected to the third wiring. The capacitor capacitively couples the third wiring and the gate of the second transistor. The first circuit is capable of storing a weight as an analog value. The first transistor is typically an oxide semiconductor transistor.

6 Claims, 15 Drawing Sheets

Related U.S. Application Data continuation of application No. 15/158,860, filed on May 19, 2016, now Pat. No. 10,141,069.

(51) Int. Cl.
  *H01L 29/786* (2006.01)
  *H01L 29/423* (2006.01)
  *H01L 27/12* (2006.01)

(52) U.S. Cl.
  CPC .... *H01L 27/1255* (2013.01); *H01L 29/42384* (2013.01); *H01L 29/7869* (2013.01); *H01L 29/78648* (2013.01); *H01L 29/78696* (2013.01)

(56) References Cited

U.S. PATENT DOCUMENTS

| | | | |
|---|---|---|---|
| 5,071,171 A | 12/1991 | Perratone | |
| 5,093,803 A | 3/1992 | Howard et al. | |
| 5,155,802 A | 10/1992 | Mueller et al. | |
| 5,268,320 A | 12/1993 | Holler et al. | |
| 5,343,555 A | 8/1994 | Yayla et al. | |
| 5,815,608 A | 9/1998 | Lange et al. | |
| 6,310,987 B1 | 10/2001 | Koyama | |
| 6,452,237 B1 | 9/2002 | Varshavsky | |
| 6,470,328 B1 | 10/2002 | Varshavsky | |
| 6,493,263 B1 | 12/2002 | Shibata et al. | |
| 6,646,907 B2 | 11/2003 | Ooishi | |
| 6,885,608 B2 | 4/2005 | Nagano | |
| 8,604,476 B2 | 12/2013 | Kato et al. | |
| 8,638,123 B2 | 1/2014 | Ohnuki | |
| 8,737,109 B2 | 5/2014 | Yamazaki et al. | |
| 9,122,896 B2 | 9/2015 | Ohnuki | |
| 9,449,706 B2 | 9/2016 | Yamazaki et al. | |
| 10,297,322 B2 | 5/2019 | Yamazaki et al. | |
| 2005/0073871 A1 | 4/2005 | Luk et al. | |
| 2005/0128803 A1 | 6/2005 | Luk et al. | |
| 2010/0165704 A1 | 7/2010 | Wu et al. | |
| 2012/0033487 A1 | 2/2012 | Inoue et al. | |
| 2012/0297221 A1 | 11/2012 | Ohnuki | |

FOREIGN PATENT DOCUMENTS

| | | |
|---|---|---|
| JP | 05-335482 A | 12/1993 |
| JP | 06-187472 A | 7/1994 |
| JP | 06-274661 A | 9/1994 |
| JP | 08-178637 A | 7/1996 |
| JP | 10-031551 A | 2/1998 |
| JP | 10-300165 A | 11/1998 |
| JP | 11-175653 A | 7/1999 |
| JP | 11-177889 A | 7/1999 |
| JP | 2000-057244 A | 2/2000 |
| JP | 2001-052101 A | 2/2001 |
| JP | 2012-069932 A | 4/2012 |
| JP | 2013-008352 A | 1/2013 |
| WO | WO 2012/026503 A1 | 3/2012 |

OTHER PUBLICATIONS

Bayat, M.F. et al., "Redesigning Commercial Floating-Gate Memory for Analog Computing Applications," ISCAS 2015 (IEEE International Symposium on Circuits and Systems), May 1, 2015, pp. 1921-1924.

Japanese Office Action re Application No. JP 2016-251179, dated Feb. 7, 2017.

\* cited by examiner

102

141

FIG. 12A
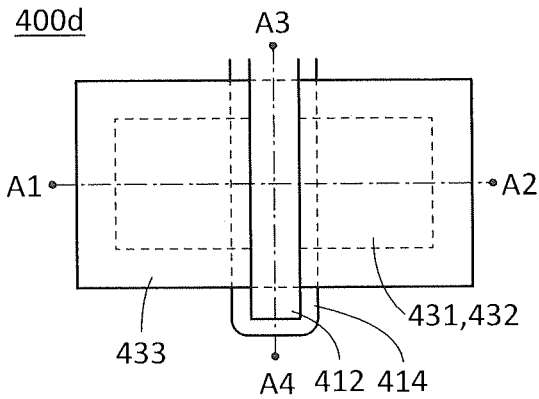
FIG. 12B
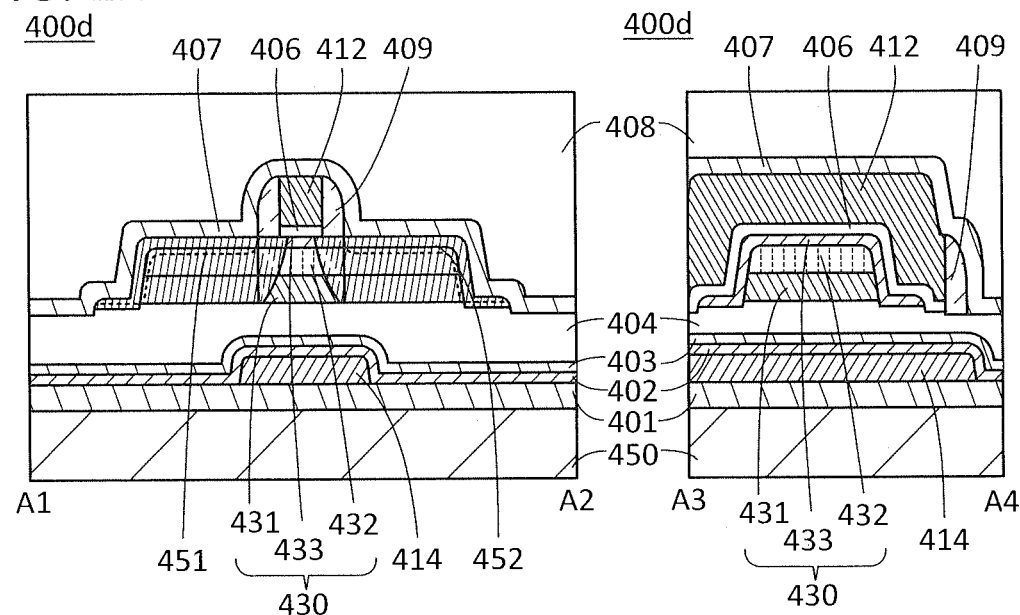
FIG. 12C
FIG. 12D
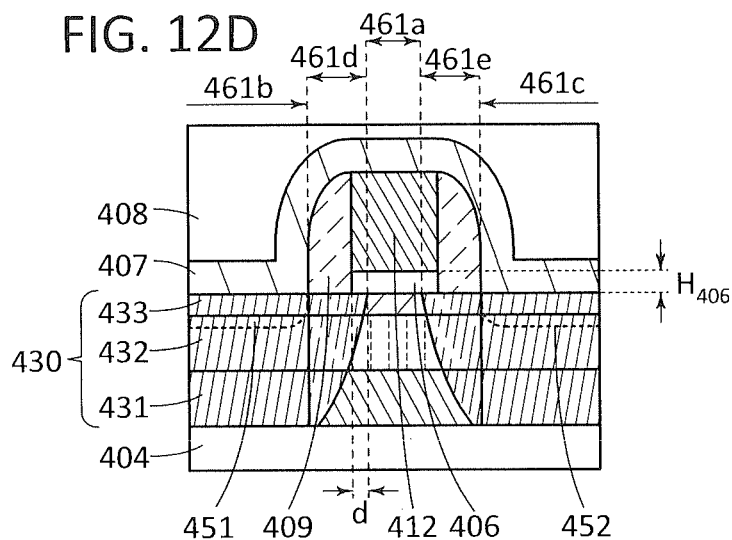

ELECTRONIC DEVICE

This application is a continuation of U.S. application Ser. No. 16/199,603, filed on Nov. 26, 2018 which is a continuation of U.S. application Ser. No. 15/158,860, filed on May 19, 2016 (now U.S. Pat. No. 10,141,069 issued Nov. 27, 2018) which are all incorporated herein by reference.

BACKGROUND OF THE INVENTION

1. Field of the Invention

This application discloses an electronic device capable of retaining an analog potential, for example.

2. Description of the Related Art

An example of machine learning is a neural network (also referred to as artificial neural network). A circuit configuration of a neural network using an analog circuit has been proposed (e.g., see Patent Documents 1 and 2).

PATENT DOCUMENT

Patent Document 1: Japanese Published Patent Application No. H5-012466
Patent Document 2: Japanese Published Patent Application No. H6-187472

SUMMARY OF THE INVENTION

An object is to provide a novel electronic device and a method for operating the same, for example.

One embodiment of the present invention is an electronic device including a first circuit, a second circuit, and first to sixth wirings. The first circuit includes a first transistor, a second transistor, and a capacitor. The second circuit includes a third transistor. A gate of the first transistor is electrically connected to the first wiring. A first terminal of the first transistor is electrically connected to the second wiring. A second terminal of the first transistor is electrically connected to a gate of the second transistor. A first terminal of the capacitor is electrically connected to the third wiring. A second terminal of the capacitor is electrically connected to the gate of the second transistor. A first terminal of the second transistor is electrically connected to the fourth wiring. A gate of the third transistor is electrically connected to the third wiring. A first terminal of the third transistor is electrically connected to the fifth wiring. A second terminal of the second transistor is electrically connected to the sixth wiring. A second terminal of the third transistor is electrically connected to the sixth wiring.

The electronic device of the above embodiment may have a function of calculating a modification amount of a gate potential of the second transistor by using at least one of a current flowing through the fourth wiring and a current flowing through the fifth wiring. In the above embodiment, a channel formation region of the first transistor may be formed using an oxide semiconductor.

In this specification and the like, the description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

A transistor is an element having three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be interchanged in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit structure, a device structure, and the like. Furthermore, a terminal, a wiring, or the like can be referred to as a node.

A voltage usually refers to a potential difference between a given potential and a reference potential (e.g., a ground potential (GND) or a source potential). Thus, a voltage can be referred to as a potential. Note that a potential has a relative value; therefore, GND does not necessarily mean 0 V.

In this specification and the like, ordinal numbers such as "first," "second," and "third" are used to show the order in some cases. Alternatively, ordinal numbers may be used to avoid confusion among components, in which case they do not limit the number or the order of components. Moreover, for example, it is possible to replace the term "first" with the term "second" or "third" in describing one embodiment of the present invention.

Other matters regarding the description of this specification and the like will be described in Embodiment 5.

One embodiment of the present invention can provide a novel electronic device or a method for operating the novel electronic device. One embodiment of the present invention can achieve the reduction in size or power consumption of an electronic device. For example, one embodiment of the present invention can be applied to a computing system for machine learning. One embodiment of the present invention is typically an electronic device to which a weight is input as an analog value and which stores the analog value.

The description of the plurality of effects does not preclude the existence of other effects. In one embodiment of the present invention, there is no need to achieve all the effects described above. In one embodiment of the present invention, objects and effects other than the above and novel structures will be apparent from and can be derived from the description of the specification and the drawings.

BRIEF DESCRIPTION OF THE DRAWINGS

In the accompanying drawings:

FIG. 12A is a top view illustrating a structure example of a transistor, FIG. 12B is a cross-sectional view along the line A1-A2 in FIG. 12A, FIG. 12C is a cross-sectional view along the line A3-A4 in FIG. 12A, and FIG. 12D is a partial enlarged view of FIG. 12B;

DETAILED DESCRIPTION OF THE INVENTION

Figure 1:
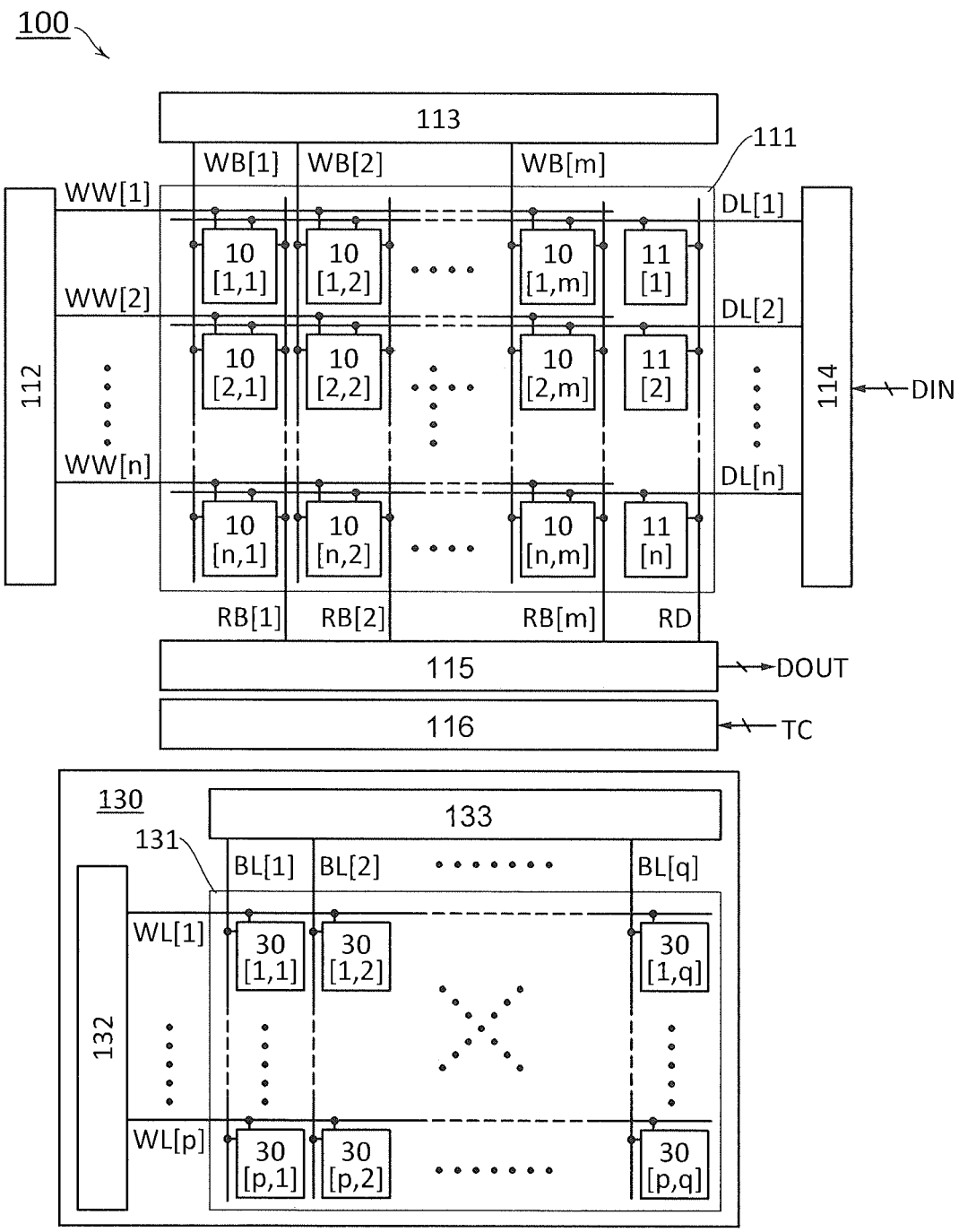
FIG. 1 is a block diagram illustrating a structure example of an electronic device.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Any of the embodiments described below can be combined as appropriate. In the case where some structure examples (including a manufacturing method, an operating method, and the like) are given in one embodiment, any of the structure examples can be combined as appropriate, and any of the structure examples can be combined with one or more structure examples described in the other embodiments.

In the drawings, the same components, components having similar functions, components formed of the same material, or components formed at the same time are sometimes denoted by the same reference numerals, and the description thereof is not repeated in some cases.

When a plurality of elements denoted by the same reference numerals need to be distinguished from each other, "[1]", "_1", "_2", "[i, j]", or the like is sometimes added to the reference numerals. For example, to distinguish a plurality of wirings WL from each other, the wiring WL in a second row is sometimes described as a wiring WL_2 using an address number (row number). The term "wiring WL" is simply used when a given row or column is not specified.

In this specification, a high power supply potential VDD may be abbreviated to a potential VDD or VDD, for example. The same applies to other components (e.g., a signal, a voltage, a potential, a circuit, an element, an electrode, and a wiring).

Embodiment 1

A neural network is an information processing system modeled on a biological neural network. An example of a neural network model is a hierarchical network structure with hierarchical artificial neurons. An artificial neuron receives a plurality of inputs and generates at least one output. For each artificial neuron, weights corresponding to the signal transmission efficiency of a synapse with respect to each input node, and a threshold value corresponding to the membrane potential of a neuron cell are set. Using the weights and the threshold value, one output value is obtained from a plurality of input signals. In a typical artificial neuron, the total sum of products of all input values and the weights (weighted sums or product sums) is obtained, the threshold value is subtracted from the weighted sum, and an output value is determined by a transfer function (e.g., a step function or a sigmoid function) using the obtained value as an input. This output value is an input value of an artificial neuron in the next level. In supervised learning, an output value and a supervisory signal are compared to calculate a modification amount of weight from the difference, and the weight is modified. Each of the weights and the threshold value are modified in some cases.

The value of an input signal of an artificial neuron is preferably a continuous value (analog value), not a discrete value of "0" and "1" (digital value). Accordingly, it is efficient to use an analog signal as an input signal of an artificial neuron and process the analog input signal in the artificial neuron. If a digital processing circuit is used as an artificial neuron, a complicated circuit is required to reduce a given weight (that corresponds to weakening bonds between synapses of other neuron cells), or to escape from a local solution and converge to a right solution when a calculation result is a local solution, for example. Thus, the size of an electronic device increases and in addition, power consumption increases.

As a storage means to maintain analog values (weights and threshold value), static random access memory (SRAM), dynamic random access memory (DRAM), flash memory, or the like can be used; however, the following issues would arise. In the case of using SRAM, an analog-to-digital converter for converting an analog value into a digital value is required. In flash memory, controlling writing of an analog value is difficult, and rewrite cycles are limited. DRAM does not have a limitation on rewrite cycles in principle but needs frequent fresh operations to hold an analog value, resulting in higher power consumption. Furthermore, if the size of a storage capacitor is increased to reduce the adverse effect of leakage of charge from the storage capacitor, power consumption of a write circuit is increased.

This embodiment explains an electronic device that can be used in a computing system for machine learning, and specifically discloses an electronic device capable of storing weights and a threshold value as analog values. FIG. 1 is a block diagram illustrating a structure example of an electronic device.

<<Electronic Device>>

An electronic device 100 illustrated in FIG. 1 includes an artificial neural array (ANA) 111, a row decoder 112, a column decoder 113, an input circuit 114, an output circuit 115, an analog signal processing circuit 116, and a memory 130. The electronic device 100 may be referred to as an artificial neural network system or an artificial neural network.

The ANA 111 includes a plurality of circuits 10, a plurality of circuits 11, a plurality of wirings WW, a plurality of wirings WB, a plurality of wirings DL, a plurality of wirings RB, and one wiring RD. The circuits 10 are arranged in an array of n rows and m columns and the circuits 11 are arranged in an array of n rows and one column, where n is an integer greater than 1 and m is an integer greater than 0. To match the arrangement of the circuits 10, n wirings WW, n wirings DL, m wirings WB, and m wirings RB are provided. The circuit 10[ij] is electrically connected to the wirings WW[i], WB[j], DL[i], and RB[j]. Here, i is an integer greater than 1 and less than or equal to n, and j is an integer greater than 0 and less than or equal to m. The circuit 11[j] is electrically connected to the wirings DL[j] and RD. The circuit 10 is an artificial neuron that is a basic unit of an artificial neural network.

The n wirings WW are electrically connected to the row decoder 112. The m wirings WB are electrically connected to the column decoder 113. The row decoder 112 and the column decoder 113 are peripheral circuits for writing weights or threshold values to the circuits 10.

Data DIN is input data to be processed by the ANA 111. Here, the data DIN is an analog voltage signal, and the voltage value of the data DIN corresponds to an input value of the ANA 111. The data DIN is written to the ANA 111 by the input circuit 114. The n wirings DL are electrically connected to the input circuit 114.

For example, the electronic device 100 may be configured such that data is input to each of the wirings DL[1] to DL[n−1], analog data corresponding to a threshold value is input to the wiring DL[n], and calculation for subtracting the threshold value from the weighted sum is performed. To achieve this structure, the configuration of the circuits 10[n,1] to 10[n,m] for holding a threshold value may be different from that of the circuits 10 in the first to (n−1)th rows. For another example, the electronic device 100 may be configured such that data is input to each of the wirings DL[1] to DL[n], a threshold value is held in the output circuit 115, and the output circuit 115 performs calculation for subtracting the threshold value from the weighted sum.

The output circuit 115 is a circuit for reading data from the ANA 111. The output circuit 115 performs arithmetic processing on an analog signal input through the m wirings RB and the wiring RD and generates data DOUT. The data DOUT is an analog output signal of the electronic device 100. That is, the output circuit 115 is an analog signal processing circuit.

The analog signal processing circuit 116 is a circuit for generating a learning signal from a supervisory signal. A signal TC in the diagram is a supervisory signal. A learning signal has a value obtained by comparing an output signal of the electronic device 100 and a supervisory signal. Here, a learning signal that the analog signal processing circuit 116 generates is a signal with a value obtained by calculation using the data DOUT and the signal TC. Furthermore, the analog signal processing circuit 116 calculates a modification amount of weight on the basis of a learning signal. The calculated modification amount is stored in the memory 130 as an analog value. The modification amount, which is stored in the memory 130, is used for arithmetic operation to calculate a modification amount in the next learning.

In other words, for each learning, the analog signal processing circuit 116 performs analog arithmetic operation on a learning signal and the modification amount obtained in the previous learning and obtains a modification amount. Based on the obtained modification amount, the weight stored in the circuit 10 is updated. To update the weight, first, the row decoder 112 and the column decoder 113 are driven, and the weight stored in the circuit 10 (weight $W_{pv}$) is written to the output circuit 115 through the wiring RB. The output circuit 115 calculates a new weight (weight $W_{nw}$) that is the sum of the read weight $W_{pv}$ and the modification amount. The weight $W_{nw}$ is sent to the column decoder 113. The weight $W_{nw}$ is written to a target circuit 10 by the row decoder 112 and the column decoder 113.

Figure 2:
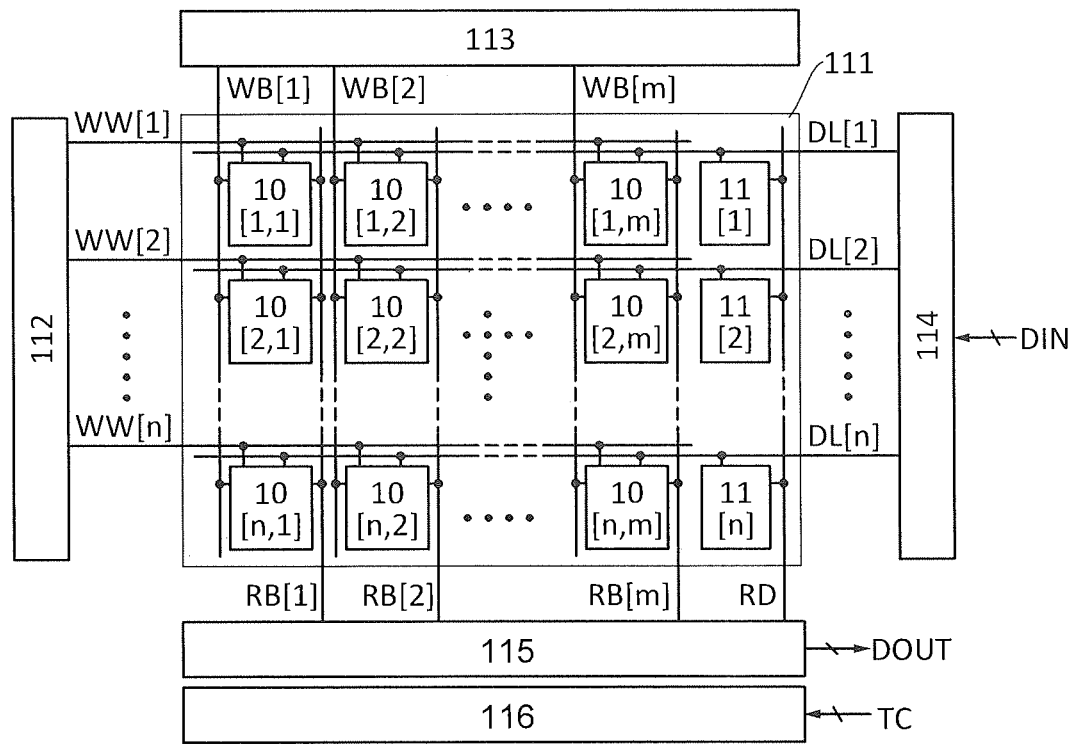
FIG. 2 is a block diagram illustrating a structure example of an electronic device.

Although the modification amount obtained in the previous learning is not essential to calculation of the weight $W_{nw}$, the use of this modification amount allows early convergence. When the modification amount obtained in the previous learning is not used for calculation of the weight $W_{nw}$, an artificial neural network system may be configured with an electronic device 101 (FIG. 2) that does not include the memory 130.

Note that in the electronic devices 100 and 101, it is possible to control the wirings DL with the row decoder 112. In this case, the wirings DL are electrically connected to the row decoder 112.

The memory 130 includes a memory cell array 131, a row decoder 132, and a column decoder 133. The memory cell array 131 includes a plurality of memory cells 30, a plurality of wirings WL, and a plurality of wirings BL.

The memory cells 30 are arranged in an array of p rows and q columns, where p and q are each an integer of 1 or greater. To match the arrangement of the memory cells 30, p wirings WL and q wirings BL are provided. The memory cell 30 is electrically connected to one wiring WL and one wiring BL. The wiring WL is a word line and is electrically connected to the row decoder 132. The wiring BL is a bit line and is electrically connected to the column decoder 133. Data is written to and read from the memory cell array 131 by the row decoder 132 and the column decoder 133.

<ANA>

Figure 3A:
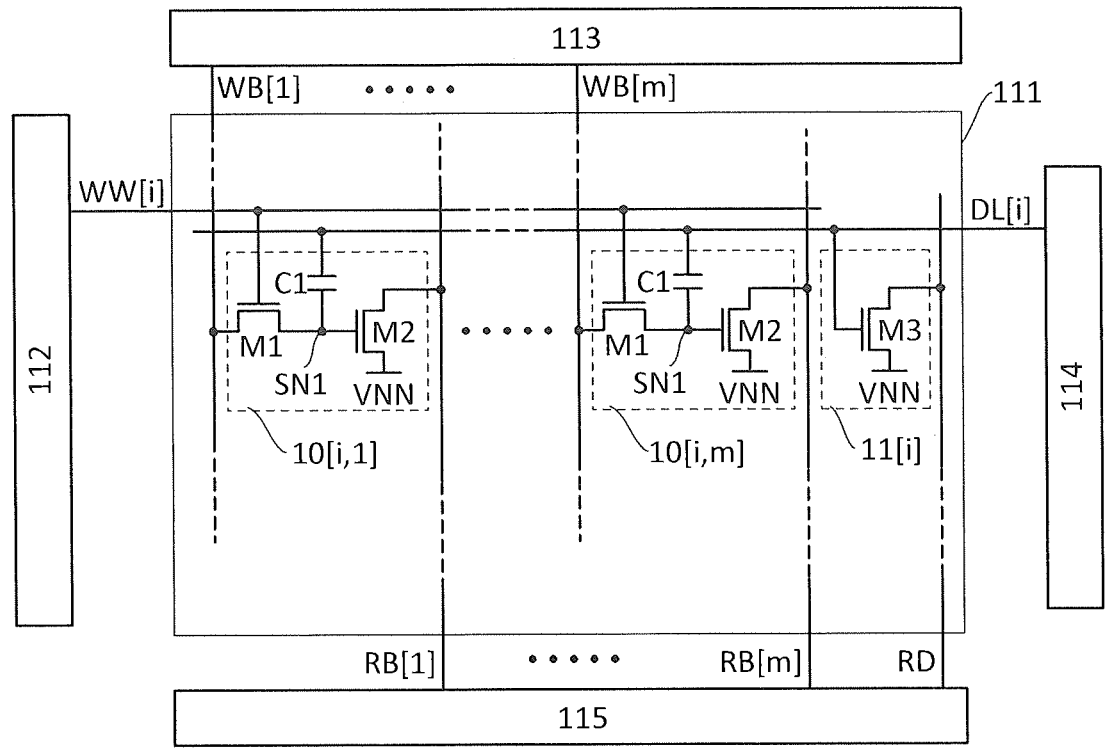
FIG. 3A is a circuit diagram illustrating a structure example of an artificial neural array (ANA)

FIG. 3A illustrates a configuration example of the ANA 111. The circuits 10 each include a node SN1, transistors M1 and M2, and a capacitor C1. The circuits 11 each include a transistor M3.

(Circuit 10)

The node SN1 is a retention node. The potential of the node SN1 corresponds to a weight stored in the circuit 10. The capacitor C1 is a storage capacitor for holding the potential of the node SN1. A first terminal and a second terminal of the capacitor C1 are electrically connected to the wiring DL and the node SN1, respectively. A gate, a first terminal, and a second terminal of the transistor M1 are electrically connected to the wiring WW, the wiring WB, and the node SN1, respectively. The on/off state of the transistor M1 is controlled by the wiring WW. The transistor M1 controls electrical connection between the node SN1 and the wiring WW. A gate, a first terminal, and a second terminal of the transistor M2 are electrically connected to the node SN1, the wiring RB, and a power supply line (VNN line) for supplying a potential VNN, respectively.

To write a weight to the circuit 10, first, analog data (weight data) that has a voltage value corresponding to the weight value is written to the wiring WB by the column decoder 113. Then, the transistor M1 is turned on by the row decoder 112. Thus, the weight data, which has been written to the wiring WB, is written to the node SN1.

To read the weight from the circuit 10, the potential of the wiring DL is increased by the input circuit 114. Along with the increase in the potential of the wiring DL, the potential of the node SN1 also increases. The on-state current (source-drain current) of the transistor M2 flows, and the potential of the wiring RB changes. The weight value is obtained by sensing the potential of the wiring RB by the output circuit 115.

(Circuit 11)

The circuit 11 has a configuration where the transistor M1 and the capacitor C1 are omitted from the circuit 10. The transistor M3 can have the same device structure as the transistor M2. A gate, a first terminal, and a second terminal of the transistor M3 are electrically connected to the wiring DL, the wiring RD, and the VNN line, respectively.

<<Operation Example of Electronic Device>>

An example of operating the electronic device 100 will be described with reference to FIG. 1 and FIG. 3A.

Before learning (before the data DIN is input), a current $I_{\beta W}{}^2$ that flows from the ANA 111 to the wiring RB is read and held in the output circuit 115. Here, β is a coefficient and W is an analog voltage that depends on a potential $V_w$ of the node SN1. Note that an initial weight value of each circuit 10 may be a random value. Thus, it is possible not to write an initial weight value before reading of the current $I_{RB0}$; alternatively, an initial weight value may be written to each circuit 10 before reading of the current $I_{RB0}$.

Next, the data DIN is input to the input circuit 114 to implement learning. The input circuit 114 writes an analog potential $V_x$ corresponding to the input value to the wiring DL in each row. A current $I_{RB1}=\beta(X+W)^2$ flows through the wiring RB and a current $I_{RD1}=\beta X^2$ flows through the wiring RD, where X is an analog voltage that depends on the analog potential $V_x$.

The output circuit 115 calculates the difference in current flowing through the wiring RB[i], $\Delta I_{RB1}[i]=I_{RB1}[i]-I_{RD1}-I_{RB0}[i]$, and sums $\Delta I_{RB1}$ of the m wirings RB. Thus, a value corresponding to a current 2βΣWX is obtained. In the output circuit 115, a circuit that calculates the difference in current can be a general circuit such as an operational amplifier. A circuit that deals with a transfer function such as a step function or a sigmoid function can be an inverter circuit or a comparator circuit, for example. In the case of using an inverter circuit, a transfer function can be differentiated using a current flowing through the inverter circuit.

Next, as described above, a modification amount of weight is calculated, and the modified weight is written to the circuit 10.

When a leakage current from the node SN1 (typically a leakage current from the capacitor C1 and the transistors M1 and M2) can be adequately reduced in the circuit 10, variation of the potential of the node SN1 can be suppressed while the circuit 10 does not implement learning (after learning ends). Accordingly, in this period, the operation of the row decoder 112, the column decoder 113, the input circuit 114, and the output circuit 115 can be stopped, leading to lower power consumption of the electronic device 100.

One of causes of the leakage current that causes variation of the potential of the node SN1 is a leakage current between the source and drain of the transistor M1 in the off state (i.e., off-state current). A transistor using a metal oxide as a semiconductor (referred to as oxide semiconductor transistor or OS transistor) features an ultralow off-state current and thus is suitable for the transistor M1.

An oxide semiconductor has a bandgap of 3.0 eV or higher; thus, an OS transistor has a low leakage current due to thermal excitation and, as described above, has an extremely low off-state current. A channel formation region of an OS transistor preferably contains an oxide semiconductor containing at least one of indium (In) and zinc (Zn). A typical example of such an oxide semiconductor is an In—M—Zn oxide (M is Al, Ga, Y, or Sn, for example). By reducing impurities serving as electron donors, such as moisture or hydrogen, and reducing oxygen vacancies, an i-type (intrinsic) or a substantially i-type oxide semiconductor is obtained. Here, such an oxide semiconductor can be referred to as a highly purified oxide semiconductor. By using a highly purified oxide semiconductor, the off-state current of the OS transistor that is normalized by channel width can be as low as several yoctoamperes per micrometer to several zeptoamperes per micrometer. An OS transistor and an oxide semiconductor will be described in Embodiments 3 and 5.

An analog potential held at the node SN1 is frequently updated while the electronic device 100 implements learning. If a transistor using silicon as a semiconductor (Si transistor) is used as the transistor M1, the circuit 10 needs to be refreshed even during learning. In contrast, when an OS transistor is used as the transistor M1, refresh of the circuit 10 is not necessary because variation of the potential of the node SN1 is suppressed.

An OS transistor has a higher upper limit of voltages applied between the source and drain and between the source and gate than a Si transistor (i.e., excels in withstand voltage). Consequently, the use of OS transistors as the transistors M1 and M2 allows the node SN1 to hold a higher voltage, and as a result, voltages applied to the wirings WW and DL and the like can be increased.

Figure 3B:
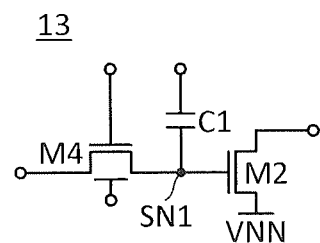
FIG. 3B is a circuit diagram illustrating a configuration example of a circuit included in the ANA.

FIG. 3B is a variation example of the circuit 10. A circuit 13 in FIG. 3B is provided with a transistor M4 with a backgate, instead of the transistor M1. The transistor M4 is preferably an OS transistor like the transistor M1. Controlling the backgate potential of the transistor M4 can change the threshold voltage of the transistor M4. As a result, the leakage current of the transistor M4 can be changed, for example. The backgate potential of the transistor M4 may be controlled in each circuit 13, or per block in the ANA 111 when the ANA 111 is divided into a plurality of blocks.

When the leakage current of the transistor M4 increases while learning is not implemented, the potential of the node SN1 decreases. This corresponds to weakening bonds between synapses.

When the leakage current of the transistor M4 increases during learning, a correct weight is not written to the circuit 13. A calculation result tends to be a local solution particularly when a neural network implements supervised learning (also referred to as back propagation). In such a case, increasing the leakage current of the transistor M4 as appropriate may lead to a situation in which escape from a local solution and convergence to a right solution are possible. In other words, the electronic device 100 does not need to be provided with a large-scale circuit for achieving escape from a local solution and convergence to a right solution, resulting in the reduction in size or power consumption of the electronic device 100.

A method for changing the leakage current of the transistor M4 is not limited to controlling the backgate potential.

For example, the leakage current of the transistor M4 can be increased by ultraviolet irradiation. The same applies to the transistor Ml.

FIGS. 4A to 4E illustrate circuit configuration examples of memory cells suitable for the memory cell 30. A memory cell 31 illustrated in FIG. 4A includes a transistor M31, a transistor M35, a capacitor C2, and a node SN2. The memory cell 31 is a gain cell that includes two transistors. The memory cell 31 is a memory circuit that has theoretically unlimited rewrite cycles and is capable of storing an analog potential.

The node SN2 retains a potential corresponding to data. The capacitor C2 is a storage capacitor for retaining the potential of the node SN2. The transistor M31 is a write transistor. Data is written to the node SN2 when the transistor M31 is turned on. The transistor M35 is a read transistor and its gate is electrically connected to the node SN2.

Figure 4A:
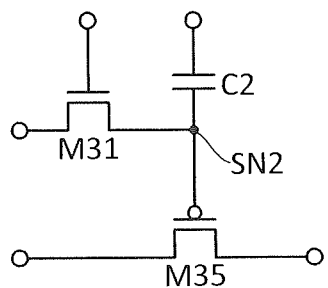
FIGS. 4A to 4E are circuit diagrams each illustrating a configuration example of a memory cell.
Figure 4B:
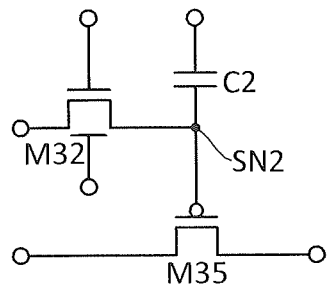
Figure 4C:
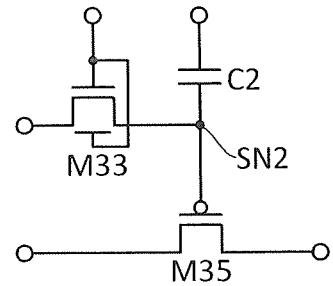

A memory cell 32 illustrated in FIG. 4B is a variation example of the memory cell 31 and is provided with a transistor M32 having a backgate, instead of the transistor M31. A memory cell 33 illustrated in FIG. 4C is another variation example of the memory cell 31 and is provided with a transistor M33 having a backgate, instead of the transistor M31. Although the backgate of the transistor M33 is electrically connected to its gate in FIG. 4C, the backgate may be electrically connected to its source or drain.

The transistors M31 to M33 are preferably OS transistors with an ultralow off-state current, in which case the retention time of the memory cells 31 to 33 can be increased. In the memory cells 31 to 33, the transistor M35 is a p-channel transistor but may be an n-channel transistor. In the case of using an n-channel transistor, the transistor M35 may be an OS transistor or a Si transistor.

Figure 4D:
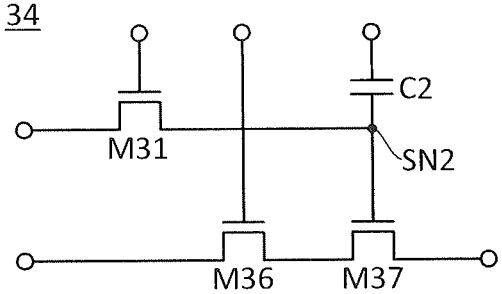

A memory cell 34 illustrated in FIG. 4D is a gain cell that includes three transistors. Like the memory cell 31, the memory cell 34 is a memory circuit that has theoretically unlimited rewrite cycles and is capable of storing an analog potential.

The memory cell 34 includes the transistor M31, a transistor M36, a transistor M37, the capacitor C2, and the node SN2. The transistor M32 or the transistor M33 may be provided instead of the transistor M31. Each of the transistors M36, and M37 may be an OS transistor or a Si transistor. Each of the transistors M36 and M37 may be a p-channel transistor.

Figure 4E:
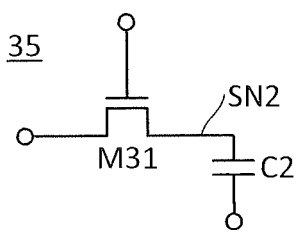

A memory cell 35 illustrated in FIG. 4E has a circuit configuration similar to that of a DRAM cell. Like the memory cell 31, the memory cell 35 is a memory circuit that has theoretically unlimited rewrite cycles and is capable of storing an analog potential. The memory cell 35 includes the transistor M31, the capacitor C2, and the node SN2. The transistor M32 or the transistor M33 may be provided instead of the transistor M31.

Figure 5A:
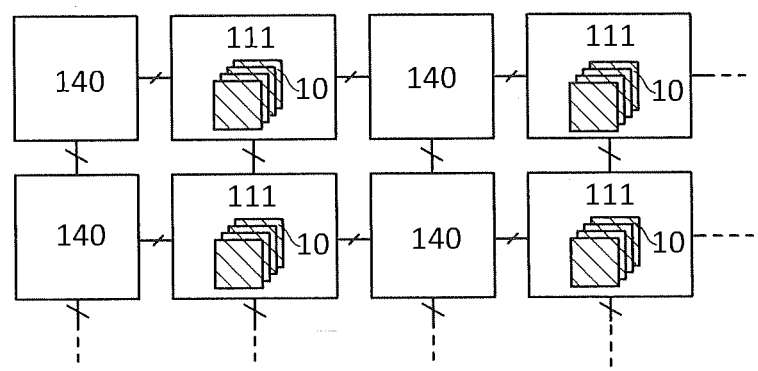
FIG. 5A is a block diagram illustrating a structure example of an electronic device.

It is possible to construct an artificial neural network system that has a complex function by connecting a plurality of ANAs 111. Moreover, a plurality of ANAs 111 make it possible to construct an artificial neural network system that has a structure like that of a field-programmable gate array (FPGA). In that case, the ANA 111 is regarded as a logic element and two ANAs 111 are electrically connected by a programmable switch. FIG. 5A illustrates an example of an electronic device with such a structure.

Figure 5B:
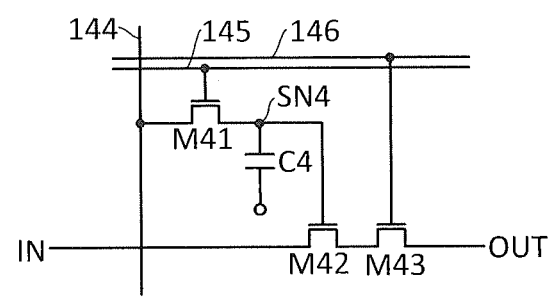
FIG. 5B is a circuit diagram illustrating a configuration example of a routing switch.

An electronic device 102 illustrated in FIG. 5A includes a plurality of ANAs 111 and routing switch arrays 140. The routing switch array 140 includes a plurality of routing switches. FIG. 5B illustrates a configuration example of the routing switch.

A routing switch 141 illustrated in FIG. 5B is a programmable routing switch. An output node of the ANA 111 is electrically connected to a node IN, and an input node of another ANA 111 is electrically connected to a node OUT. The routing switch 141 includes transistors M41 to M43, a capacitor C4, a node SN4, and wirings 144 to 146. Electrical continuity between the node IN and the node OUT is set by the potential of the node SN4. The capacitor C4 is a storage capacitor for the node SN4. The transistor M41 is preferably an OS transistor like the transistor M31 in the memory cell 31, in which case the state of the routing switch 141 can be maintained for a long time. The transistor M41 may be a transistor with a backgate, like the transistor M32 or the transistor M33.

An artificial neural network can be constructed with the electronic device of this embodiment. The electronic device of this embodiment enables, for instance, sound recognition and image recognition. For example, sound recognition performed by the electronic device of this embodiment allows sound to input information to an electronic appliance including the electronic device and operate the electronic appliance. For another example, image recognition performed by the electronic device of this embodiment enables an electronic appliance including the electronic device to perform face or fingerprint recognition, input of handwritten letters, and optical text recognition.

Embodiment 2

This embodiment will show examples of a fabrication method and a structure of an electronic device, and electronic appliances and the like including the electronic device.

<<Example of Method for Fabricating Electronic Component>>

Figure 6A:
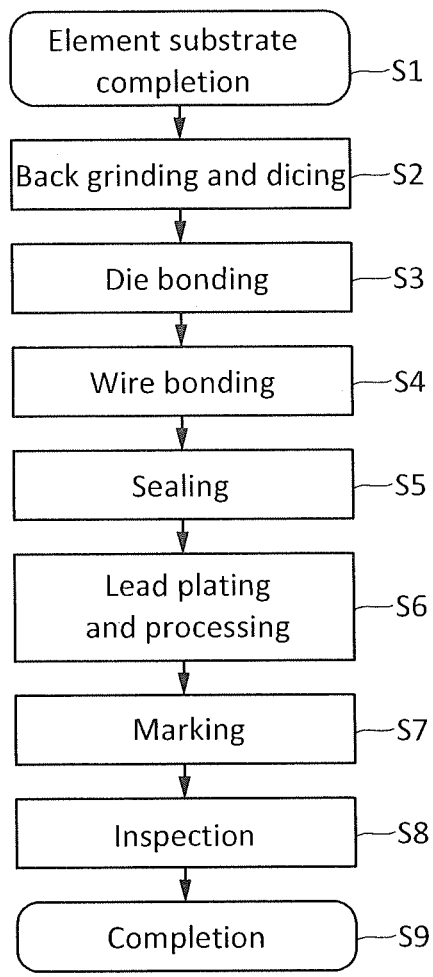
FIG. 6A is a flow chart illustrating an example of a method for fabricating an electronic component.

FIG. 6A is a flow chart illustrating an example of a method for fabricating an electronic component. An electronic component is completed in such a manner that a plurality of detachable components are integrated on a printed circuit board through a process of fabricating devices such as transistors (wafer process) and an assembly process (post-process). FIG. 6A shows an example of the post-process. An electronic component completed through the post-process in FIG. 6A can be referred to as a semiconductor package, an IC package, or a package. For an electronic component, there are various standards and names corresponding to the direction or the shape of terminals; hence, one example of the electronic component will be described here.

First, an element substrate is completed through a wafer process (Step S1). Then, a dicing step of dividing the substrate into a plurality of chips is performed (Step S2). Before the substrate is divided into a plurality of pieces, the substrate is thinned to reduce warpage or the like of the substrate caused in the wafer process and to reduce the size of the component. The chips are picked up to be mounted on and bonded to a lead frame in a die bonding step (Step S3). In the die bonding step, the chip may be bonded to the lead frame with a resin or a tape. As the bonding method, a method suitable for the product can be selected. In the die bonding step, the chip may be mounted on an interposer to be bonded. In a wire bonding step, a lead of the lead frame is electrically connected to an electrode on the chip with a metal fine line (wire) (Step S4). As a metal wire, a silver wire or a gold wire can be used. Either ball bonding or wedge bonding can be used as wire bonding.

A wire-bonded chip is subjected to a molding step of sealing the chip with an epoxy resin or the like (Step S5). The lead of the lead frame is plated. Then, the lead is cut and processed into a predetermined shape (Step S6). With plating process, corrosion of the lead can be prevented, and soldering for mounting the electronic component on a printed circuit board in a later step can be performed with higher reliability. Printing process (marking) is performed on a surface of the package (Step S7). Through an inspection step (Step S8), the electronic component is completed (Step S9).

<<Structure Example of Electronic Component>>

Figure 6B:
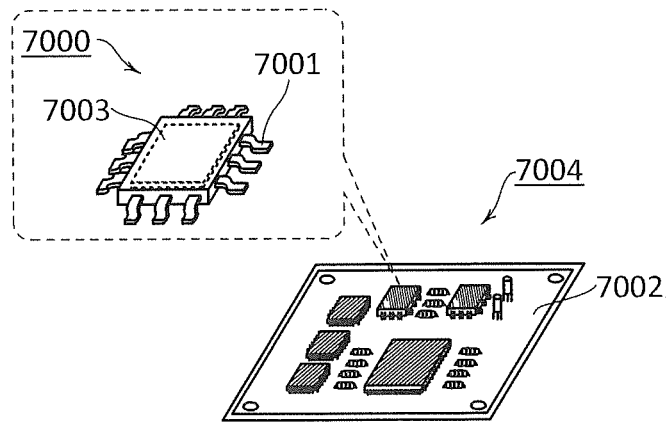
FIG. 6B is a schematic perspective view illustrating a structure example of an electronic component.

FIG. 6B is a schematic perspective view of an electronic component. FIG. 6B shows an example of a quad flat package (QFP). An electronic component 7000 illustrated in FIG. 6B includes a lead 7001 and a circuit portion 7003. The circuit portion 7003 is provided with a circuit that constitutes the electronic device of Embodiment 1, for example. The electronic component 7000 is mounted on a printed circuit board 7002, for example. A plurality of electronic components 7000 are used in combination and electrically connected to each other over the printed circuit board 7002. A completed circuit board 7004 is provided in an electronic appliance.

The electronic component 7000 can be used in various kinds of processors. For example, the electronic component 7000 can be used as an electronic component (IC chip) of electronic appliances in a wide variety of fields, such as digital signal processing, software-defined radio systems, avionic systems (electronic appliances used in aircraft, e.g., communication systems, navigation systems, autopilot systems, and flight management systems), application specific integrated circuit (ASIC) prototyping, medical image processing, sound recognition, encryption, bioinformatics, emulators for mechanical systems, radio telescopes in radio astronomy, and in-car electronic appliances.

Other examples of an electronic appliance that can be equipped with the electronic component 7000 include smartphones, portable phones, game machines including portable game machines, e-book readers, cameras (e.g., video cameras and digital still cameras), wearable information appliances (e.g., head-mounted, goggle-type, glasses-type, armband-type, bracelet-type, wristwatch-type, and necklace-type appliances), navigation systems, audio reproducing devices (e.g., car audio systems and digital audio players), tuners for reception of TV broadcasting, copiers, facsimiles, printers, multifunction printers, automated teller machines (ATM), and vending machines.

An electronic appliance including the electronic component 7000 can have the functions of the electronic device in Embodiment 1. For example, when the electronic appliance is equipped with a sound recognition function, it is possible to operate the electronic appliance and input information to the electronic appliance with sound. When the electronic appliance is equipped with an image recognition function, it is possible to perform biometric recognition such as fingerprint, vein, or face verification and input of handwritten letters, for example. FIGS. 7A to 7H illustrate specific examples of these electronic appliances.

Figure 7A:
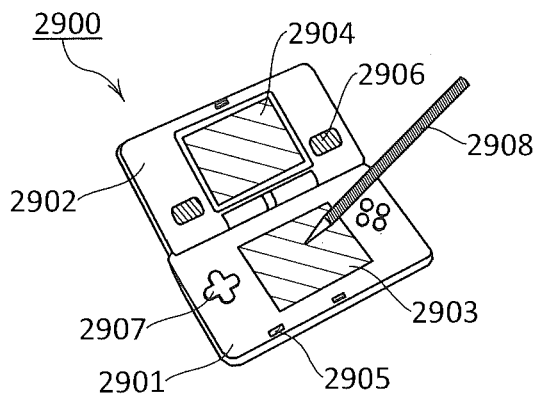
FIGS. 7A to 7H each illustrate a structure example of an electronic device.

A portable game machine 2900 illustrated in FIG. 7A includes a housing 2901, a housing 2902, a display portion 2903, a display portion 2904, a microphone 2905, a speaker 2906, an operation key 2907, and the like. The display portion 2903 is provided with a touch screen as an input device, which can be handled with a stylus 2908 or the like.

Figure 7B:
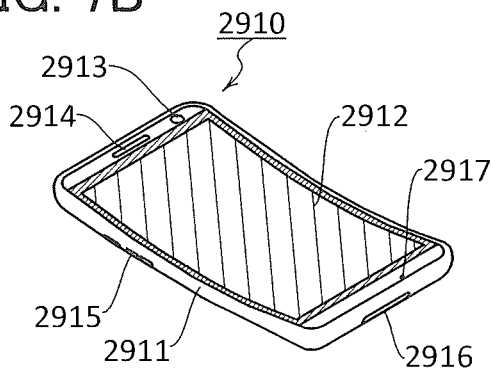

An information appliance 2910 illustrated in FIG. 7B includes a housing 2911, a display portion 2912, a microphone 2917, a speaker portion 2914, a camera 2913, an external connection portion 2916, an operation button 2915, and the like. A display panel and a touch screen that use a flexible substrate are provided in the display portion 2912. The information appliance 2910 can be used as, for example, a smartphone, a mobile phone, a tablet information appliance, a tablet PC, or an e-book reader.

Figure 7C:
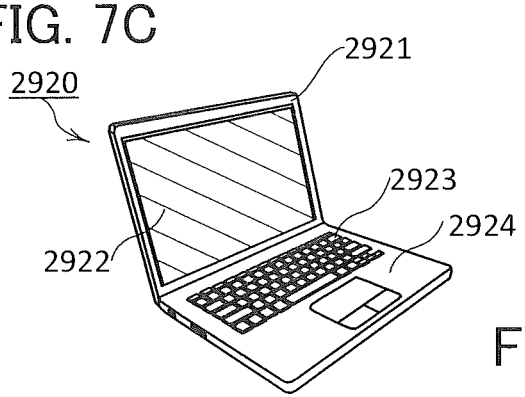

A notebook PC 2920 illustrated in FIG. 7C includes a housing 2921, a display portion 2922, a keyboard 2923, a pointing device 2924, and the like.

Figure 7D:
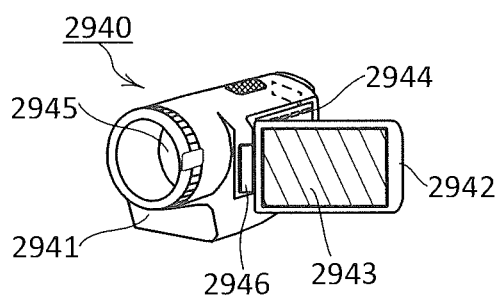

A video camera 2940 illustrated in FIG. 7D includes a housing 2941, a housing 2942, a display portion 2943, an operation key 2944, a lens 2945, a joint 2946, and the like. The operation key 2944 and the lens 2945 are provided in the housing 2941, and the display portion 2943 is provided in the housing 2942. The housings 2941 and 2942 are connected to each other with the joint 2946, and the angle between the housings 2941 and 2942 can be changed with the joint 2946. The change in the direction of an image displayed on the display portion 2943 or switching between display and non-display of an image can be performed by changing the angle between the housings 2941 and 2942.

Figure 7E:
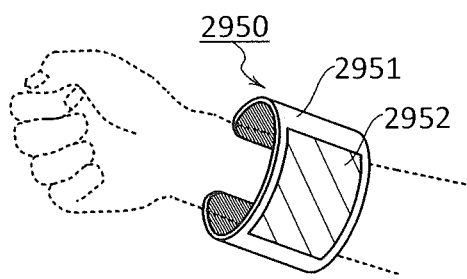

FIG. 7E illustrates an example of a bangle-type information appliance. An information appliance 2950 includes a housing 2951, a display portion 2952, and the like. The display portion 2952 is supported by the housing 2951 having a curved surface. A display panel formed using a flexible substrate is provided in the display portion 2952, whereby the information appliance 2950 can be a user-friendly information appliance that is flexible and lightweight.

Figure 7F:
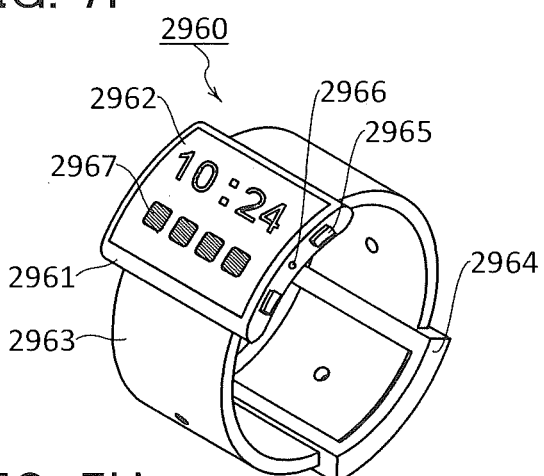

FIG. 7F illustrates an example of a wristwatch-type information appliance. An information appliance 2960 includes a housing 2961, a display portion 2962, a band 2963, a buckle 2964, an operation button 2965, an input/output terminal 2966, and the like. The information appliance 2960 is capable of executing a variety of applications such as mobile phone calls, e-mailing, viewing and editing texts, music reproduction, Internet communication, and computer games.

The display surface of the display portion 2962 is curved, and images can be displayed on the curved display surface. The display portion 2962 includes a touch sensor, and operation can be performed by touching the screen with a finger, a stylus, or the like. For example, by touching an icon 2967 displayed on the display portion 2962, an application can be started. With the operation button 2965, it is possible to perform a variety of functions such as time setting, power on/off, on/off control of wireless communication, setting and cancellation of silent mode, and setting and cancellation of power saving mode. For example, the functions of the operation button 2965 can be set by the operating system incorporated in the information appliance 2960.

The information appliance 2960 can employ near field communication based on an existing communication standard. For example, mutual communication between the information appliance 2960 and a headset capable of wireless communication can be performed, and thus hands-free calling is possible. Since the information appliance 2960 includes the input/output terminal 2966, data can be directly transmitted to and received from another information appliance via a connector. Power charging through the input/output terminal 2966 is possible. Note that the charging operation may be performed by wireless power feeding without using the input/output terminal 2966.

Figure 7G:
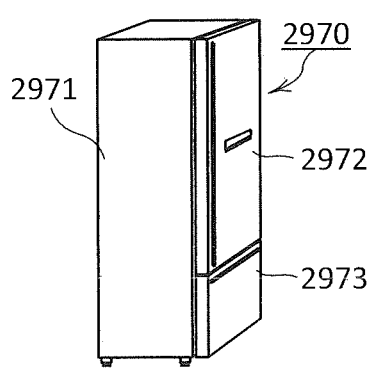

FIG. 7G illustrates an electric refrigerator-freezer as an example of a home electronic appliance. An electric refrigerator-freezer 2970 includes a housing 2971, a refrigerator door 2972, a freezer door 2973, and the like.

Figure 7H:
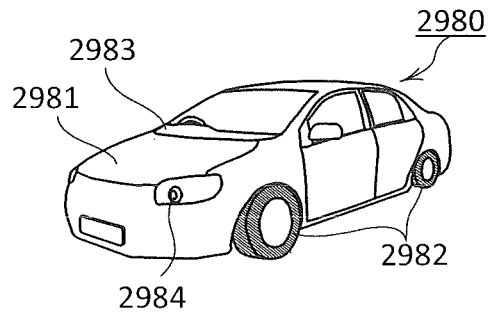

FIG. 7H is an external view illustrating a structure example of a car. A car 2980 includes a car body 2981, wheels 2982, a dashboard 2983, lights 2984, and the like. The electronic component of this embodiment can be incorporated not only in the car 2980 but also in ships, planes, and two-wheeled motor vehicles.

Embodiment 3

This embodiment will explain the device structure and the like of an OS transistor.

<<Transistor Structure Example 1>>

Figure 8A:
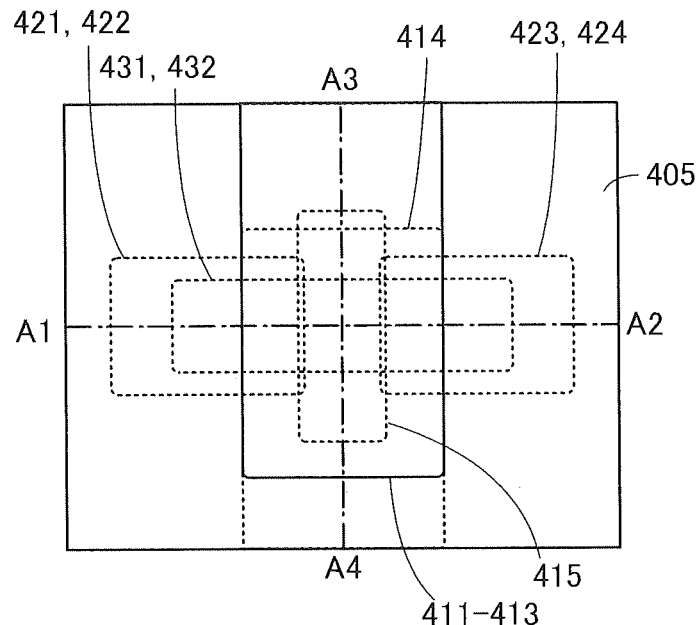
FIG. 8A is a top view illustrating a structure example of a transistor.
Figure 8B:
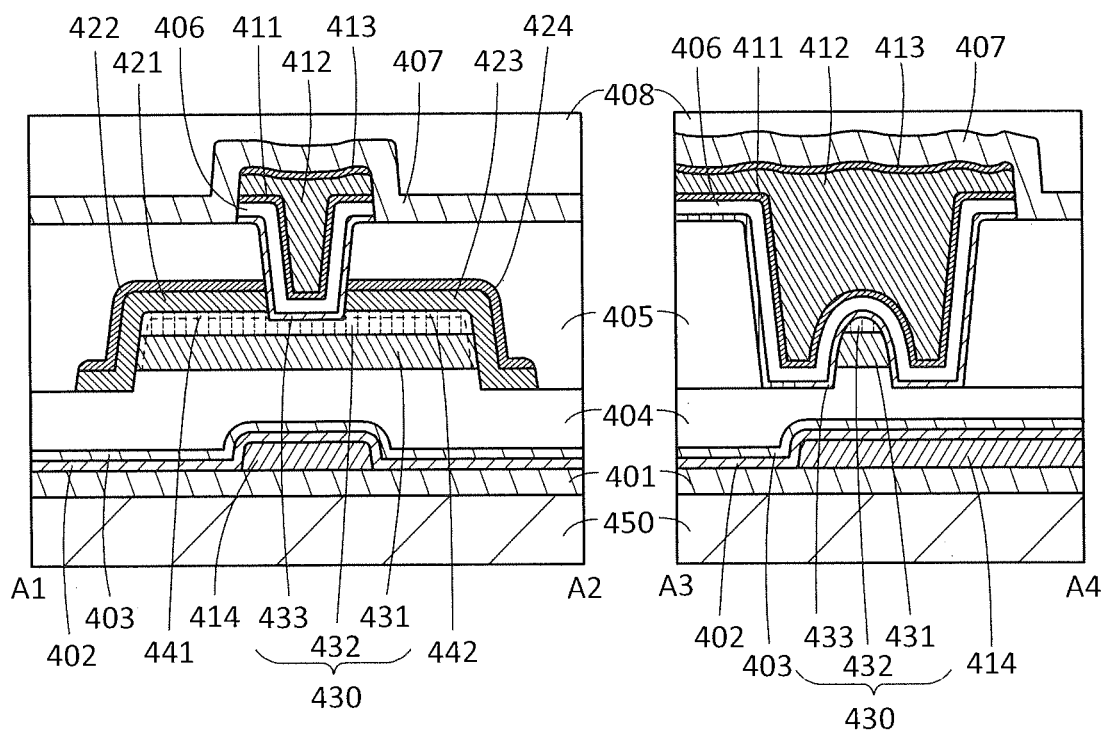
FIG. 8B is a cross-sectional view along the line A1-A2 in FIG. 8A.
Figure 8C:
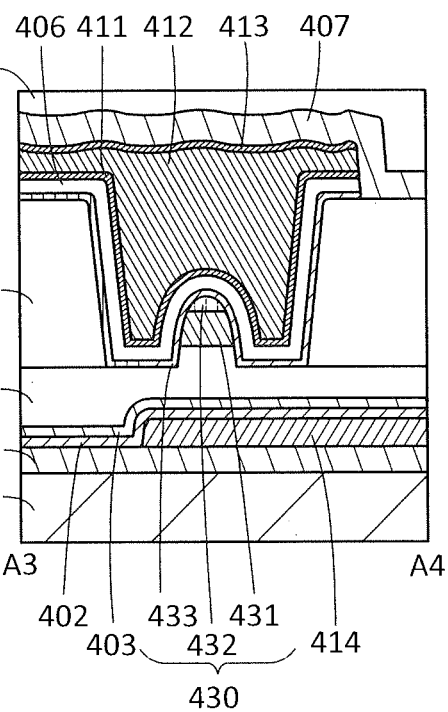
FIG. 8C is a cross-sectional view along the line A3-A4 in FIG. 8A.

FIG. 8A is a top view of a transistor 400a. FIG. 8B is a cross-sectional view along the line A1-A2 in FIG. 8A. FIG. 8C is a cross-sectional view along the line A3-A4 in FIG. 8A. Note that the direction of the line A1-A2 is sometimes referred to as a channel length direction of the transistor 400a, and the direction of the line A3-A4 as a channel width direction of the transistor 400a. Note that some components are not illustrated in FIG. 8A for simplification. The same applies to top views such as FIG. 9A.

The transistor 400a is formed over a substrate 450. The transistor 400a includes insulating films 401 to 408, conductive films 411 to 414, conductive films 421 to 424, and metal oxides 431 to 433. Here, the metal oxides 431 to 433 are collectively referred to as a metal oxide 430 in some cases.

The metal oxide 432 is a semiconductor, and a channel formation region is provided in the metal oxide 432. The metal oxide 431 and the metal oxide 432 form a metal oxide stack. The stack includes regions 441 and 442. The region 441 is formed in a region where the conductive film 421 is in contact with the stack. The region 442 is formed in a region where the conductive film 423 is in contact with the stack. In the stack, the regions 441 and 442 are low resistance regions whose resistance is lower than that of the other regions. The region 441 included in the stack contributes to the decrease in the contact resistance between the conductive film 421 and the stack. Similarly, the region 442 included in the stack contributes to the decrease in the contact resistance between the conductive film 423 and the stack.

A stack of the conductive films 421 and 422 and a stack of the conductive films 423 and 424 serve as a source electrode and a drain electrode. The conductive film 422 is less likely to allow oxygen to pass through than the conductive film 421. It is thus possible to prevent a decrease in the conductivity of the conductive film 421 due to oxidation. Similarly, the conductive film 424 is less likely to allow oxygen to pass through than the conductive film 423, which can prevent a decrease in the conductivity of the conductive film 423 due to oxidation.

The conductive films 411 to 413 form a gate electrode (front gate electrode) of the transistor 400a. Regions in the conductive films 411 to 413 serving as the gate electrode are formed in a self-aligned manner so as to fill an opening formed in the insulating film 405 and the like. It is preferred that the conductive films 411 and 413 be less likely to allow oxygen to pass through than the conductive film 412. It is thus possible to prevent a decrease in the conductivity of the conductive film 412 due to oxidation. The conductive film 414 forms a backgate electrode. The conductive film 414 may be omitted in some cases.

The insulating films 405 to 408 serve as a protective insulating film or an interlayer insulating film of the transistor 400a. The insulating film 406 in particular forms a gate insulating film. The insulating films 401 to 404 serve as a base insulating film of the transistor 400a. The insulating films 402 to 404 also have a function of a gate insulating film on the backgate side.

As illustrated in FIG. 8C, the side surface of the metal oxide 432 is surrounded by the conductive film 411. With such a device structure, the metal oxide 432 can be electrically surrounded by an electric field of the gate electrode (the conductive films 411 to 413). A structure in which a semiconductor is electrically surrounded by an electric field of a gate electrode is referred to as a surrounded channel (s-channel) structure. In the s-channel structure, a channel is formed in the entire metal oxide 432 (bulk). In the transistor with the s-channel structure, a large amount of current can flow between a source and a drain, increasing the on-state current. The s-channel structure contributes to high on-state current and thus is suitable for a semiconductor device that requires a miniaturized transistor, such as a processor and memory. The s-channel structure can reduce the size of a transistor; consequently, a semiconductor device including a transistor with the s-channel structure can have a high integration degree and high density.

As illustrated in FIG. 8B, the stacked conductive films 411 to 413 have a region where they overlap the conductive film 422 with the insulating films 405 and 406 positioned therebetween. The stacked conductive films 411 to 413 also have a region where they overlap the conductive film 424 with the insulating films 405 and 406 positioned therebetween. These regions serve as parasitic capacitance caused between the gate electrode and the source or drain electrode and might decrease the operation speed of the transistor 400a. This parasitic capacitance can be reduced when the transistor 400a is provided with a relatively thick insulating film 405. The insulating film 405 preferably contains a material with a low relative dielectric constant.

Figure 9A:
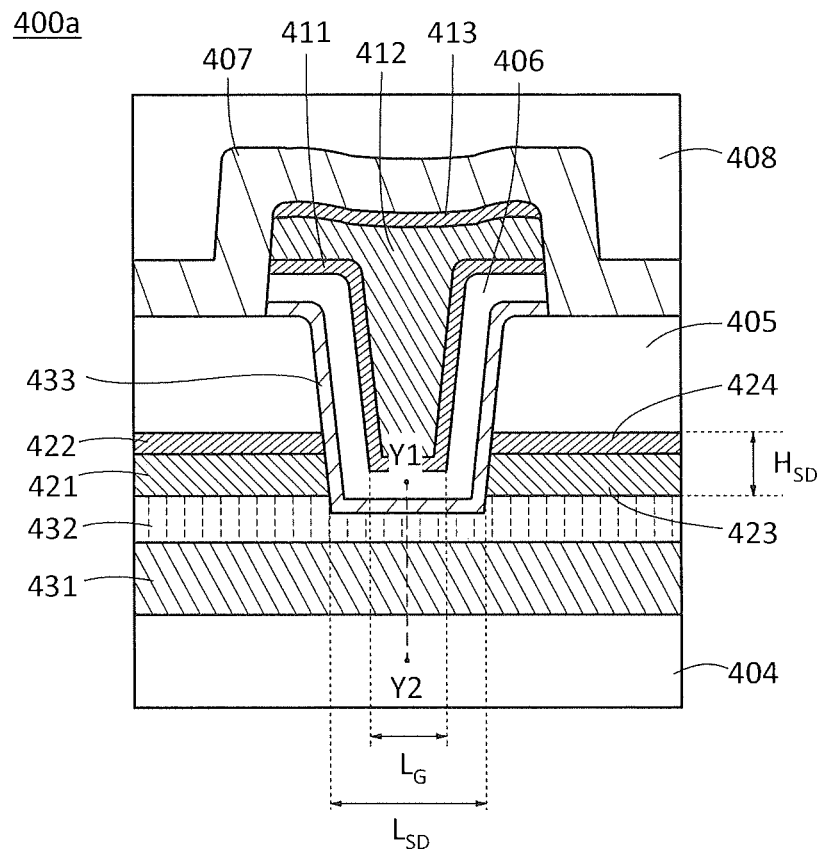
FIG. 9A is a partial enlarged view of FIG. 8B.

FIG. 9A is an enlarged view of the channel formation region of the transistor 400a. In FIG. 9A, a width $L_G$ denotes the length of a region where the bottom surface of the conductive film 411 that faces parallel to the top surface of the metal oxide 432 with the insulating film 406 and the metal oxide 433 positioned therebetween. The width $L_G$ is the line width of the gate electrode of the transistor 400a. In FIG. 9A, a width $L_{SD}$ denotes the length between the conductive film 421 and the conductive film 423. The width $L_{SD}$ is the length between the source and drain electrodes of the transistor 400a.

The width $L_{SD}$ is generally determined by the minimum feature size. As shown in FIG. 9A, the width $L_G$ is narrower than the width $L_{SD}$. This means that the line width of the gate electrode of the transistor 400a can be made smaller than the minimum feature size. For example, the width $L_G$ can range from 5 nm to 60 nm, preferably from 5 nm to 30 nm.

In FIG. 9A, a height $H_{SD}$ denotes the total thickness of the conductive films 421 and 422, or the total thickness of the conductive films 423 and 424. The thickness of the insulating film 406 is preferably less than or equal to the height $H_{SD}$, in which case the electric field of the gate electrode can be applied to the entire channel formation region. For example, the thickness of the insulating film 406 is less than or equal to 30 nm, preferably less than or equal to 10 nm.

The parasitic capacitance between the conductive films 411 and 422 and the parasitic capacitance between the conductive films 411 and 424 are inversely proportional to the thickness of the insulating film 405. For example, the thickness of the insulating film 405 is preferably three times or more, further preferably five times or more the thickness of the insulating film 406, in which case these parasitic capacitances become negligibly small and high-frequency characteristics of the transistor 400a are improved. Components of the transistor 400a will be described below.

<Metal Oxide>

The metal oxide 432 is an oxide semiconductor containing indium (In), for example. The metal oxide 432 has high carrier mobility (electron mobility) by containing indium, for example. The metal oxide 432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 432 preferably contains zinc (Zn). When containing zinc, the metal oxide is easily crystallized in some cases.

Note that the metal oxide 432 is not limited to the oxide semiconductor containing indium. The metal oxide 432 may be an oxide semiconductor that does not contain indium and contains at least one of zinc, gallium, and tin (e.g., zinc tin oxide or gallium tin oxide).

For the metal oxide 432, an oxide semiconductor with a wide energy gap is used, for example. The energy gap of the metal oxide 432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. A CAAC-OS described later is preferably used for the metal oxide 432.

For example, the metal oxides 431 and 433 preferably contain at least one of the metal elements contained in the metal oxide 432, in which case an interface state is less likely to be generated at the interface between the metal oxides 431 and 432 and at the interface between the metal oxides 432 and 433.

In the case of using an In—M—Zn oxide as the metal oxide 431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 431 is formed by a sputtering method, a sputtering target that satisfies the above composition is preferably used. For example, In:M:Zn is preferably 1:3:2 or 1:3:4.

In the case of using an In—M—Zn oxide as the metal oxide 432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 432 is formed by a sputtering method, a sputtering target that satisfies the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 432 may be 4:2:3 or in the neighborhood of 4:2:3.

In the case of using an In—M—Zn oxide as the metal oxide 433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 433 may be a metal oxide that is the same type as that of the metal oxide 431.

The metal oxide 431 or the metal oxide 433 does not necessarily contain indium in some cases. For example, the metal oxide 431 or the metal oxide 433 may be gallium oxide.

<Energy Band Structure>

Figure 9B:
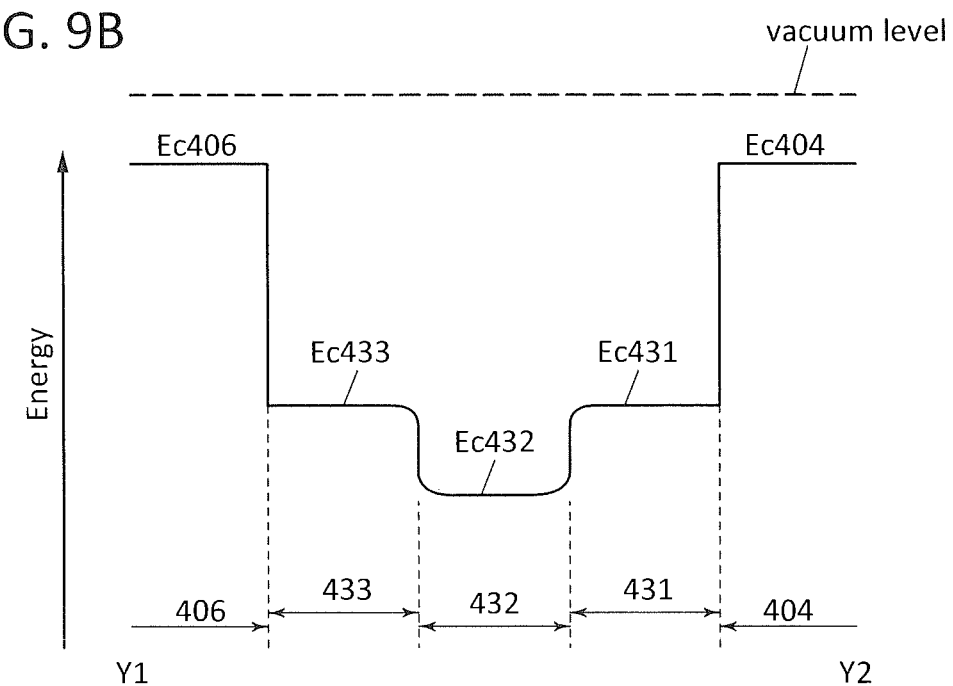
FIG. 9B is an energy band diagram of a transistor.

The function and effect of the metal oxide 430, which is a stack of the metal oxides 431 to 433, will be described with reference to the energy band diagram of FIG. 9B. FIG. 9B shows an energy band structure of a portion along the line Y1-Y2 in FIG. 9A. In FIG. 9B, Ec404, Ec431, Ec432, Ec433, and Ec406 indicate the energy at the bottom of the conduction band of the insulating film 404, the metal oxide 431, the metal oxide 432, the metal oxide 433, and the insulating film 406, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as "ionization potential"). Note that the energy gap can be measured using a spectroscopic ellipsometer. The energy difference between the vacuum level and the top of the valence band can be measured using an ultraviolet photoelectron spectroscopy (UPS) device.

Since the insulating films 404 and 406 are insulators, Ec404 and Ec406 are closer to the vacuum level (i.e., have a lower electron affinity) than Ec431, Ec432, and Ec433.

The metal oxide 432 is preferably a metal oxide having an electron affinity higher than those of the metal oxides 431 and 433. For example, as the metal oxide 432, a metal oxide having an electron affinity higher than those of the metal oxides 431 and 433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

Since indium gallium oxide has a small electron affinity and a high oxygen-blocking property, the metal oxide 433 preferably contains indium gallium oxide. The gallium atomic ratio [Ga/(In+Ga)] is, for example, greater than or equal to 70%, preferably greater than or equal to 80%, more preferably greater than or equal to 90%.

When gate voltage is applied to the transistor 400a, a channel is formed in the metal oxide 432 having the highest electron affinity in the metal oxides 430. At this time, electrons move mainly in the metal oxide 432, not in the metal oxides 431 and 433. Hence, the on-state current of the transistor 400a hardly varies even when the density of interface states, which inhibit electron movement, is high at the interface between the metal oxide 431 and the insulating film 404 or at the interface between the metal oxide 433 and the insulating film 406. The metal oxides 431 and 433 function as an insulating film.

In some cases, there is a mixed region of the metal oxides 431 and 432 between the metal oxides 431 and 432. Furthermore, in some cases, there is a mixed region of the metal oxides 432 and 433 between the metal oxides 432 and 433. The mixed region has a low density of interface states; thus, the stack of the metal oxides 431 to 433 has a band structure where energy at each interface and in the vicinity of the interfaces is changed continuously (continuous junction).

As described above, the interface between the metal oxides 431 and 432 or the interface between the metal oxides 432 and 433 has a low interface state density. Hence, electron movement in the metal oxide 432 is less likely to be inhibited, so that the on-state current of the transistor 400a can be increased.

Electron movement in the transistor 400a is inhibited, for example, when physical unevenness in a channel formation region is large. To increase the on-state current of the transistor 400a, for example, the root mean square (RMS) roughness in a measurement area of 1 μm×1 μm of the top surface or bottom surface of the metal oxide 432 (here, the bottom surface of the metal oxide 432 refers to a surface where the metal oxide 432 is formed and corresponds to the top surface of the metal oxide 431) is less than 1 nm, preferably less than 0.6 nm, more preferably less than 0.5 nm, still more preferably less than 0.4 nm. The average surface roughness (Ra) in the measurement area of 1 μm×1 μm is less than 1 nm, preferably less than 0.6 nm, more preferably less than 0.5 nm, still more preferably less than 0.4 nm. The maximum difference (P-V) in the measurement area of 1 μm×1 μm is less than 10 nm, preferably less than 9 nm, more preferably less than 8 nm, still more preferably less than 7 nm.

The electron movement is also inhibited, for example, when the density of defect states is high in a channel formation region. For example, when the metal oxide 432 contains oxygen vacancies ($V_O$), donor levels are sometimes formed by entry of hydrogen into sites of oxygen vacancies. A state in which hydrogen enters sites of oxygen vacancies may be denoted by $V_OH$ in the following description. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 432, the on-state current of the transistor can be increased in some cases.

For example, at a certain depth of the metal oxide 432 or in a certain region of the metal oxide 432, the concentration of hydrogen measured by secondary ion mass spectrometry (SIMS) is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 432, for example, there is a method in which excess oxygen contained in the insulating film 404 is moved to the metal oxide 432 through the metal oxide 431. In that case, the metal oxide 431 is preferably a layer having an oxygen-transmitting property (a layer through which oxygen is transmitted).

The metal oxide 432 can have a thickness of 1 nm to 20 nm. The thickness of the metal oxide 432 depends on the channel length and can be smaller as the channel length becomes smaller. For example, the thickness of the metal oxide 432 can range from 1 nm to 15 nm, or from 1 nm to 10 nm.

The metal oxide 431 can have a thickness of 5 nm to 200 nm, 10 nm to 120 nm, 20 nm to 120 nm, or 40 nm to 80 nm. The metal oxide 431 is preferably thicker than the metal oxide 432. A thicker metal oxide 431 can increase the distance from the interface between the adjacent insulator and the metal oxide 431 to the channel formation region.

The metal oxide 433 can have a thickness of 1 nm to 100 nm, 1 nm to 50 nm or 1 nm to 10 nm. The metal oxide 433 is preferably thinner than the metal oxide 431 to increase the on-state current of the transistor 400a.

For example, between the metal oxides 431 and 432, there is a region where the silicon concentration measured by SIMS is higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. Between the metal oxides 432 and 433, there is a region where the silicon concentration measured by SIMS is higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$.

It is preferable to reduce the concentration of hydrogen in the metal oxides 431 and 433 in order to reduce the concentration of hydrogen in the metal oxide 432. The metal oxides 431 and 433 each have a region in which the hydrogen concentration measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is also preferable to reduce the concentration of nitrogen in the metal oxides 431 and 433 in order to reduce the concentration of nitrogen in the metal oxide 432. The metal oxides 431 and 433 each have a region in which the nitrogen concentration is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$.

The metal oxides 431 to 433 can be formed by a sputtering method, a chemical vapor deposition (CVD) method, a molecular beam epitaxy (MBE) method, a pulsed laser deposition (PLD) method, an atomic layer deposition (ALD) method, or the like.

First heat treatment is preferably performed after the metal oxides 431 and 432 are formed. The first heat treatment can be performed at temperatures higher than or equal to 250° C. and lower than or equal to 650° C., preferably higher than or equal to 450° C. and lower than or equal to 600° C., more preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. With the first heat treatment, the crystallinity of the metal oxides 431 and 432 can be increased and impurities such as hydrogen and water can be removed.

FIGS. 9A and 9B illustrate an example in which the metal oxide 430 has a three-layer structure; however, one embodiment of the present invention is not limited thereto. For example, the metal oxide 430 may have a two-layer structure without the metal oxide 431 or the metal oxide 433. Alternatively, the metal oxide 430 can have an n-layer structure (n is an integer greater than 3) in which a single layer or a stack of any of the metal oxides shown as the metal oxides 431 to 433 is provided in the top or the bottom of the metal oxide 430 or between two layers of the metal oxide 430.

<Substrate>

As the substrate 450, for example, an insulator substrate, a semiconductor substrate, or a conductor substrate can be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like; and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in any of the above semiconductor substrates. Examples of the conductor substrate are a graphite substrate, a metal substrate, an alloy substrate, a conductive resin substrate, a substrate containing metal nitride, and a substrate containing metal oxide. Other examples of usable substrates are an insulator substrate provided with a conductor or a semiconductor, a semiconductor substrate provided with a conductor or an insulator, and a conductor substrate provided with a semiconductor or an insulator. Alternatively, any of the above substrates provided with an element may be used. Examples of the element provided over the substrate are a capacitor, a resistor, a rectifier, a switching element, a light-emitting element, and a memory element.

The substrate 450 may be a flexible substrate. As a method for providing a transistor over a flexible substrate, there is a method in which the transistor is formed over a non-flexible substrate and then the transistor is separated and transferred to the substrate 450 that is a flexible substrate. In this case, a separation layer is preferably provided between the non-flexible substrate and the transistor. As the substrate 450, a sheet, a film, or a foil containing a fiber may be used. The substrate 450 may have elasticity. The substrate 450 may have a property of returning to its original shape when bending or pulling is stopped, or may have a property of not returning to its original shape. The thickness of the substrate 450 should range, for example, from 5 μm to 700 μm, and ranges preferably from 10 μm to 500 μm, more preferably from 15 μm to 300 μm. When the substrate 450 has a small thickness, the weight of a semiconductor device can be reduced. When the substrate 450 has small thickness, even in the case of using glass or the like, the substrate 450 may have elasticity or a property of returning to its original shape after bending or pulling is stopped. Thus, an impact applied to a semiconductor device over the substrate 450, which is caused by dropping or the like, can be reduced. That is, a robust semiconductor device can be provided.

A flexible substrate that can be used as the substrate 450 is formed of metal, an alloy, resin, or glass or fiber thereof, for example. The coefficient of linear expansion of the flexible substrate is preferably as low as possible because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 450 because of its low coefficient of linear expansion.

<Base Insulating Film>

The insulating film 401 has a function of electrically isolating the substrate 450 from the conductive film 414. The insulating film 401 or the insulating film 402 is formed using an insulating film having a single-layer structure or a layered structure. Examples of the material for an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 402 may be formed using silicon oxide with high step coverage that is formed by reacting tetraethyl orthosilicate (TEOS), silane, or the like with oxygen, nitrous oxide, or the like. After the insulating film 402 is formed, the insulating film 402 may be subjected to planarization treatment using a CMP method or the like to improve the planarity of the top surface of the insulating film 402.

Note that in this specification and the like, oxynitride refers to a compound that contains more oxygen than nitrogen, and nitride oxide refers to a compound that contains more nitrogen than oxygen.

The insulating film 404 preferably contains an oxide. In particular, the insulating film 404 preferably contains an oxide material from which part of oxygen is released by heating. The insulating film 404 preferably contains an oxide containing oxygen more than that in the stoichiometric composition. Part of oxygen is released due to heating from an oxide film containing oxygen in excess of the stoichiometric composition. Oxygen released from the insulating film 404 is supplied to the metal oxide 430, so that oxygen vacancies in the metal oxide 430 can be reduced. Consequently, changes in the electrical characteristics of the transistor can be reduced and the reliability of the transistor can be improved.

The oxide film containing oxygen more than that in the stoichiometric composition is, for example, an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis preferably ranges from 100° C. to 700° C., or from 100° C. to 500° C.

The insulating film 404 preferably contains an oxide that can supply oxygen to the metal oxide 430. For example, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 404. To make the insulating film 404 contain excess oxygen, the insulating film 404 is formed in an oxygen atmosphere, for example. Alternatively, a region containing excess oxygen may be formed by introducing oxygen into the insulating film 404 that has been formed. These two methods may be combined.

For example, oxygen (at least including any of oxygen radicals, oxygen atoms, and oxygen ions) is introduced into the insulating film 404 that has been formed, so that a region containing excess oxygen is formed. Oxygen can be introduced by an ion implantation method, an ion doping method, a plasma immersion ion implantation method, plasma treatment, or the like. A gas containing oxygen can be used for oxygen introduction treatment. As the gas containing oxygen, oxygen, nitrous oxide, nitrogen dioxide, carbon dioxide, carbon monoxide, or the like can be used. Furthermore, a rare gas may be included in the gas containing oxygen for the oxygen introduction treatment. Moreover, hydrogen or the like may be included. For example, a mixed gas of carbon dioxide, hydrogen, and argon may be used. After the insulating film 404 is formed, the insulating film 404 may be subjected to planarization treatment using a CMP method or the like to improve the planarity of the top surface of the insulating film 404.

The insulating film 403 has a passivation function of preventing the decrease of oxygen contained in the insulating film 404. Specifically, the insulating film 403 prevents oxygen contained in the insulating film 404 from being bonded to a metal contained in the conductive film 414. The insulating film 403 has a function of blocking oxygen, hydrogen, water, an alkali metal, an alkaline earth metal, or the like. Providing the insulating film 403 can prevent outward diffusion of oxygen from the metal oxide 430 and entry of hydrogen, water, or the like into the metal oxide 430 from the outside. The insulating film 403 can be formed using an insulator containing nitride, nitride oxide, oxide, or oxynitride, for example. Examples of the insulator include silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, and hafnium oxynitride.

The threshold voltage of the transistor 400a can be controlled by injecting electrons into a charge trap layer. The charge trap layer is preferably provided in the insulating film 402 or the insulating film 403. For example, when the insulating film 403 is formed using hafnium oxide, aluminum oxide, tantalum oxide, aluminum silicate, or the like, the insulating film 403 can function as a charge trap layer.

<Backgate Electrode, Gate Electrode, Source Electrode, and Drain Electrode>

The conductive films 411 to 414 and 421 to 424 are preferably a conductive film having a single-layer structure or a layered structure containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing any of these materials as its main component. It is particularly preferable to use a high-melting-point material that has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

The conductive films 421 to 424 are preferably formed using a conductive oxide containing noble metal, such as iridium oxide, ruthenium oxide, or strontium ruthenate. Such a conductive oxide hardly takes oxygen from an oxide semiconductor even when it is in contact with the oxide semiconductor, and hardly generates oxygen vacancies in the oxide semiconductor.

<Low-Resistance Region>

The regions 441 and 442 are formed, for example, when the conductive films 421 and 423 take oxygen from the metal oxides 431 and 432. Oxygen is more likely to be extracted at higher heating temperatures. Oxygen vacancies are formed in the regions 441 and 442 through several heating steps in the fabrication process of the transistor 400a. In addition, hydrogen enters sites of the oxygen vacancies by heating, increasing the carrier concentration in the regions 441 and 442. As a result, the resistance of the regions 441 and 442 is reduced.

<Gate Insulating Film>

The insulating film 406 preferably contains an insulator with a high relative dielectric constant. For example, the insulating film 406 is preferably formed using gallium oxide, hafnium oxide, oxide containing aluminum and hafnium, oxynitride containing aluminum and hafnium, oxide containing silicon and hafnium, or oxynitride containing silicon and hafnium.

The insulating film 406 preferably has a layered structure containing silicon oxide or silicon oxynitride and an insulator with a high relative dielectric constant. Since silicon oxide and silicon oxynitride have thermal stability, a combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 433, entry of silicon from silicon oxide or silicon oxynitride into the metal oxide 432 can be suppressed.

When silicon oxide or silicon oxynitride is closer to the metal oxide 433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<Interlayer Insulating Film and Protective Insulating Film>

The insulating film 405 preferably contains an insulator with a low relative dielectric constant. For example, the insulating film 405 preferably contains silicon oxide, silicon oxynitride, silicon nitride oxide, silicon nitride, or a resin. Alternatively, the insulating film 405 preferably has a layered structure containing silicon oxide or silicon oxynitride and a resin. Since silicon oxide and silicon oxynitride have thermal stability, a combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 407 has a function of blocking oxygen, hydrogen, water, an alkali metal, an alkaline earth metal, or the like. Providing the insulating film 407 can prevent outward diffusion of oxygen from the metal oxide 430 and entry of hydrogen, water, or the like into the metal oxide 430 from the outside. The insulating film 407 can be formed using an insulator containing nitride, nitride oxide, oxide, or oxynitride, for example. Examples of the insulator include silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, and hafnium oxynitride. An aluminum oxide film is preferably used as the insulating film 407 because it is highly effective in preventing transmission of both oxygen and impurities such as hydrogen and moisture.

When the insulating film 407 is formed by a method using plasma containing oxygen (e.g., by a sputtering method or a CVD method), oxygen can be added to side and top surfaces of the insulating films 405 and 406. It is preferable to perform second heat treatment at any time after the formation of the insulating film 407. Through the second heat treatment, oxygen added to the insulating films 405 and 406 is diffused in the insulating films to reach the metal oxide 430, whereby oxygen vacancies in the metal oxide 430 can be reduced.

The insulating film 407 has a function of blocking oxygen and prevents oxygen from being diffused upward across the insulating film 407. The insulating film 403 has a function of blocking oxygen and prevents oxygen from being diffused downward across the insulating film 403.

Note that the second heat treatment is performed at a temperature that allows oxygen added to the insulating films 405 and 406 to be diffused to the metal oxide 430. For example, the description of the first heat treatment can be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 404 can be inhibited. Note that in the case where heating at the time of formation of the layers doubles as the second heat treatment, the second heat treatment is not necessarily performed. As described above, oxygen can be supplied to the metal oxide 430 from above and below through the formation of the insulating film 407 and the second heat treatment. Oxygen may be added to the insulating films 405 and 406 by forming a film containing indium oxide (e.g., In-M-Zn oxide) as the insulating film 407.

The insulating film 408 can be formed using an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, the insulating film 408 can be formed using a resin that can be used for the insulating film 405, such as a polyimide resin. The insulating film 408 may be a stack containing any of the above materials.

<<Transistor Structure Example 2>>

Figure 10A:
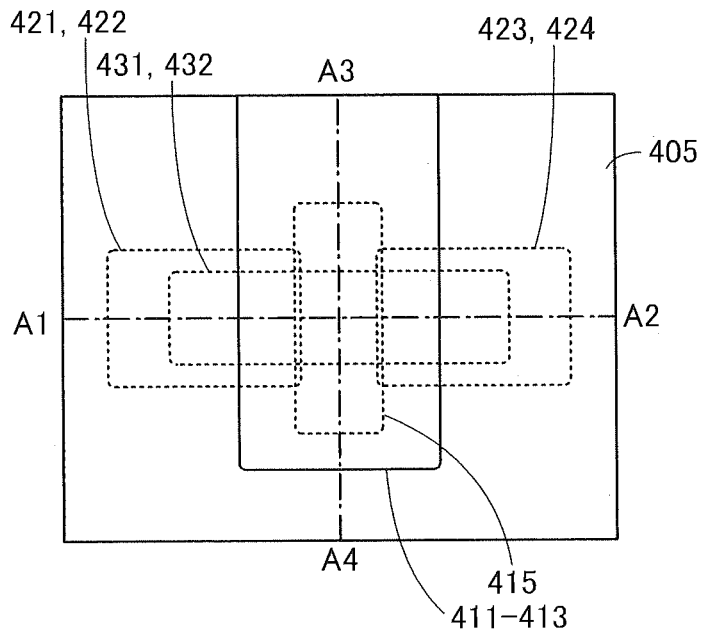
FIG. 10A is a top view illustrating a structure example of a transistor.
Figure 10B:
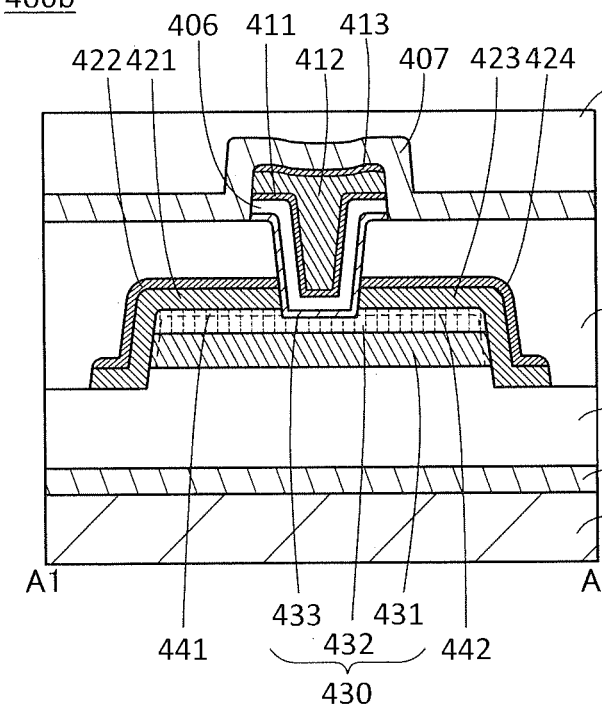
FIG. 10B is a cross-sectional view along the line A1-A2 in FIG. 10A.
Figure 10C:
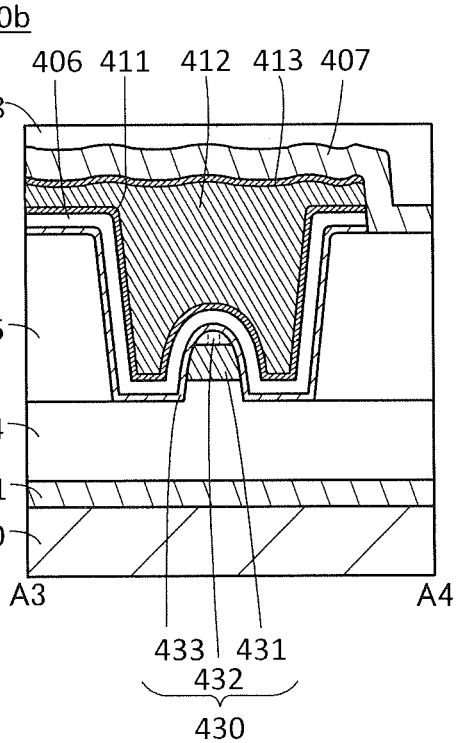
FIG. 10C is a cross-sectional view along the line A3-A4 in FIG. 10A.

The conductive film 414 and the insulating films 402 and 403 may be omitted in the transistor 400a illustrated in FIGS. 8A to 8C. An example of such a structure is illustrated in FIGS. 10A to 10C. FIG. 10A is a top view of a transistor 400b. FIG. 10B is a cross-sectional view taken along the line A1-A2 in FIG. 10A. FIG. 10C is a cross-sectional view taken along the line A3-A4 in FIG. 10A.

<<Transistor Structure Example 3>>

Figure 11A:
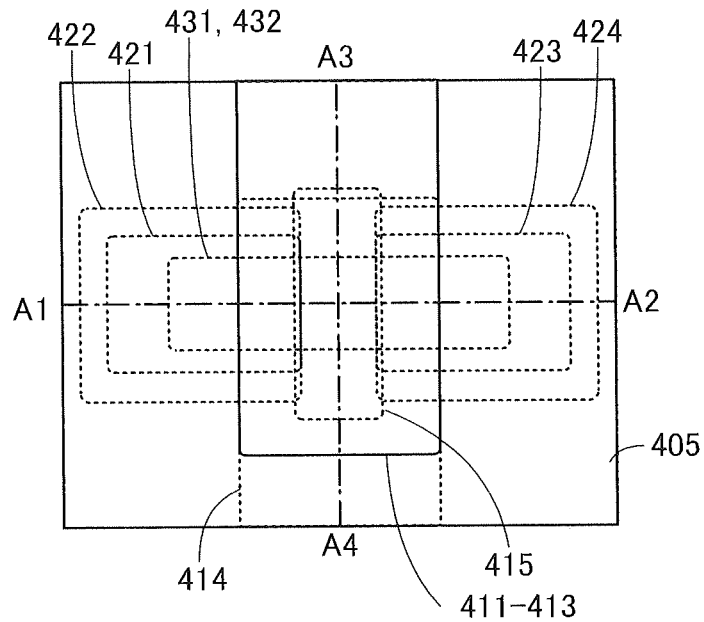
FIG. 11A is a top view illustrating a structure example of a transistor.
Figure 11B:
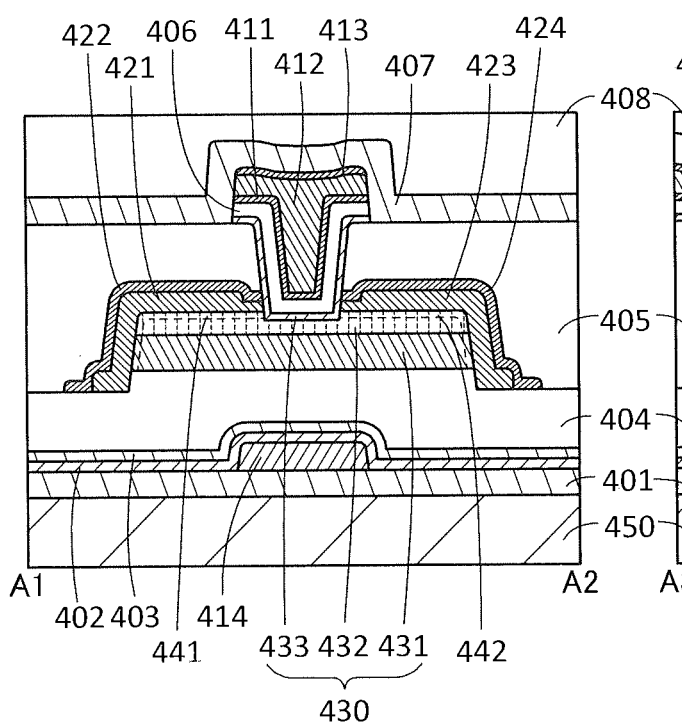
FIG. 11B is a cross-sectional view along the line A1-A2 in FIG. 11A.
Figure 11C:
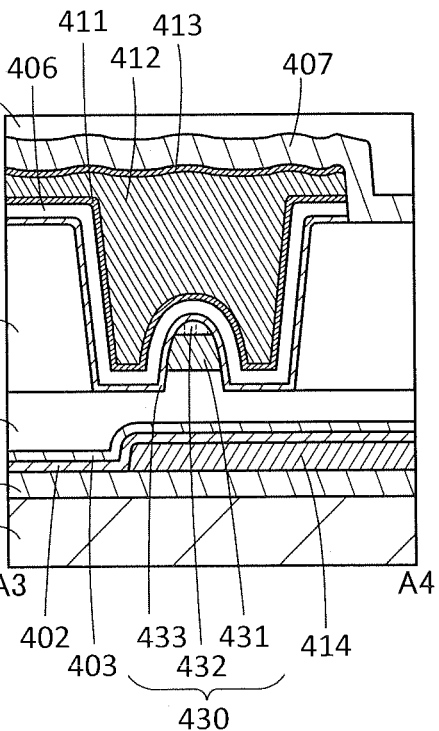
FIG. 11C is a cross-sectional view along the line A3-A4 in FIG. 11A.

In the transistor 400a shown in FIGS. 8A to 8C, parts of the conductive films 421 and 423 that overlap with the gate electrode (the conductive films 411 to 413) may be reduced in thickness. FIGS. 11A to 11C illustrate an example of such a structure. FIG. 11A is a top view of a transistor 400c. FIG. 11B is a cross-sectional view taken along the line A1-A2 in FIG. 11A. FIG. 11C is a cross-sectional view taken along the line A3-A4 in FIG. 11A.

As illustrated in FIG. 11B, in the transistor 400c, part of the conductive film 421 that overlaps with the gate electrode is reduced in thickness, and the conductive film 422 covers the conductive film 421. Part of the conductive film 423 that overlaps with the gate electrode is also reduced in thickness, and the conductive film 424 covers the conductive film 423. With such a structure, the distance between the gate and source electrodes or between the gate and drain electrodes can be increased. This results in a reduction in the parasitic capacitance generated between the gate electrode and the source and drain electrodes. As a result, a transistor capable of high-speed operation can be obtained.

<<Transistor Structure Example 4>>

FIG. 12A is a top view of a transistor 400d. FIG. 12B is a cross-sectional view taken along the line A1-A2 in FIG. 12A. FIG. 12C is a cross-sectional view taken along the line A3-A4 in FIG. 12A. The transistor 400d has the s-channel structure like the transistor 400a and the like. In the transistor 400d, an insulating film 409 is provided in contact with a side surface of the conductive film 412 that forms a gate electrode. The insulating film 409 and the conductive film 412 are covered with the insulating films 407 and 408. The insulating film 409 functions as a sidewall insulating film of the transistor 400d. As in the transistor 400a, the gate electrode of the transistor 400d may be a stack of the conductive films 411 to 413.

The insulating film 406 and the conductive film 412 overlap with the conductive film 414 and the metal oxide 432 at least partly. The side edge of the conductive film 412 in the channel length direction is preferably approximately aligned with the side edge of the insulating film 406 in the channel length direction. Here, the insulating film 406 functions as a gate insulating film of the transistor 400d, and the conductive film 412 functions as the gate electrode of the transistor 400d.

The metal oxide 432 has a region that overlaps with the conductive film 412 with the metal oxide 433 and the insulating film 406 positioned therebetween. It is preferred that the outer edge of the metal oxide 431 be approximately aligned with the outer edge of the metal oxide 432, and the outer edge of the metal oxide 433 be outside of the outer edges of the metal oxides 431 and 432. The transistor of this embodiment is not limited to having a shape where the outer edge of the metal oxide 433 is outside of the outer edge of the metal oxide 431. For example, the outer edge of the metal oxide 431 may be outside of the outer edge of the metal oxide 433, or the side edge of the metal oxide 431 may be approximately aligned with the side edge of the metal oxide 433.

FIG. 12D is a partial enlarged view of FIG. 12B. As illustrated in FIG. 12D, regions 461a to 461e are formed in the metal oxide 430. The regions 461b to 461e have a higher concentration of dopant and therefore have a lower resistance than the region 461a. Furthermore, the regions 461b and 461c have a higher concentration of hydrogen and thus have a much lower resistance than the regions 461d and 461e. The concentration of dopant in the region 461a is, for example, less than or equal to 5%, less than or equal to 2%, or less than or equal to 1% of the maximum concentration of dopant in the region 461b or the region 461c. Instead of the term "dopant," the term "donor," "acceptor," "impurity," or "element" may be used.

As illustrated in FIG. 12D, in the metal oxide 430, the region 461a overlaps substantially with the conductive film 412, and the regions 461b to 461e are the regions other than the region 461a. In the regions 461b and 461c, the top surface of the metal oxide 433 is in contact with the insulating film 407. In the regions 461d and 461e, the top surface of the metal oxide 433 is in contact with the insulating film 406 or the insulating film 409. That is, as illustrated in FIG. 12D, the border between the regions 461b and 461d overlaps with the border between the side edges of the insulating films 407 and 409. The same applies to the border between the regions 461c and 461e. Here, part of the regions 461d and 461e preferably overlaps with part of a region where the metal oxide 432 and the conductive film 412 overlap with each other (i.e., a channel formation region). For example, preferably, the side edges of the regions 461d and 461e in the channel length direction are placed inward from the conductive film 412 by a distance d. Here, the thickness $H_{406}$ of the insulating film 406 and the distance d preferably satisfy $0.25H_{406} < d < H_{406}$.

In the above manner, the regions 461d and 461e are formed in part of the region where the metal oxide 430 and the conductive film 412 overlap with each other. Accordingly, the channel formation region of the transistor 400d is in contact with the low-resistance regions 461d and 461e, and a high-resistance offset region is not formed between the region 461a and each of the regions 461d and 461e; thus, the on-state current of the transistor 400d can be increased. Furthermore, since the side edges of the regions 461d and 461e in the channel length direction are formed so as to satisfy the above range, the regions 461d and 461e can be prevented from being formed too deeply in the channel formation region and always conducted.

The regions 461b to 461e are formed by ion doping treatment such as an ion implantation method. Thus, as shown in FIG. 12D, the boundary between the regions 461a and 461d sometimes gets closer to the boundary between the regions 461b and 461d with the depth in the direction from the top surface of the metal oxide 433 to the bottom surface of the metal oxide 431. The distance d in that case is the distance between the boundary between the regions 461a and 461d, which is closest to the inner part of the conductive film 412 in the direction of the dashed-dotted line A1-A2, and the side edge of the conductive film 412 on the A1 side in the direction of the dashed-dotted line A1-A2. Moreover, the boundary between the regions 461a and 461e sometimes gets closer to the boundary between the regions 461c and 461e with the depth in the direction from the top surface of the metal oxide 433 to the bottom surface of the metal oxide 431. The distance d in that case is the distance between the boundary between the regions 461a and 461e, which is closest to the inner part of the conductive film 412 in the direction of the dashed-dotted line A1-A2, and the side edge of the conductive film 412 on the A2 side in the direction of the dashed-dotted line A1-A2.

In some cases, for example, the regions 461d and 461e in the metal oxide 431 do not overlap with the conductive film 412. In that case, at least part of the regions 461d and 461e in the metal oxide 431 or the metal oxide 432 is preferably formed in a region overlapping with the conductive film 412.

In addition, low-resistance regions 451 and 452 are preferably formed in the metal oxides 431 to 433 in the vicinity of the interface with the insulating film 407. The low-resistance regions 451 and 452 contain at least one of elements included in the insulating film 407. Preferably, part of the low-resistance regions 451 and 452 is substantially in contact with or overlaps partly with the region where the metal oxide 432 and the conductive film 412 overlap with each other (i.e., the channel formation region).

Since a large part of the metal oxide 433 is in contact with the insulating film 407, the low-resistance regions 451 and 452 are likely to be formed in the metal oxide 433. The low-resistance regions 451 and 452 in the metal oxide 433 contain a higher concentration of the element included in the insulating film 407 than the other regions of the metal oxide 433 (e.g., the region of the metal oxide 433 that overlaps with the conductive film 412).

The low-resistance regions 451 and 452 are formed in the regions 461b and 461c, respectively. Ideally, the metal oxide 430 has a structure in which the concentration of added elements is the highest in the low-resistance regions 451 and 452, the second highest in the regions 461b and 461c other than the low-resistance regions 451 and 452, and the lowest in the region 461a. The added elements refer to dopant for forming the regions 461b and 461c and an element added from the insulating film 407 to the low-resistance regions 451 and 452.

Although the low-resistance regions 451 and 452 are formed in the transistor 400d, the transistor shown in this embodiment is not limited to having this structure. For example, the low-resistance regions 451 and 452 are not necessarily formed when the regions 461b and 461c have a sufficiently low resistance.

<<Transistor Structure Example 5>>

Figure 13A:
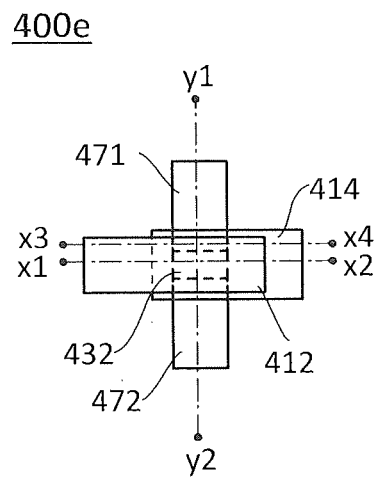
FIG. 13A is a top view illustrating a structure example of a transistor.
Figure 13B:
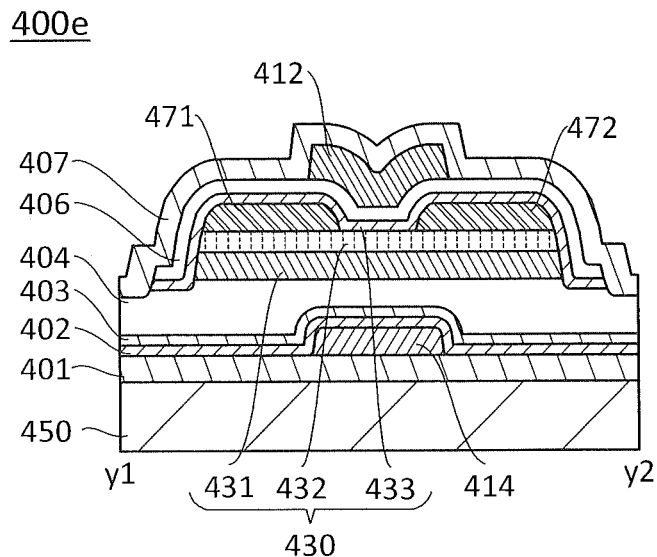
FIG. 13B is a cross-sectional view along the line y1-y2 in FIG. 13A.
Figure 13C:
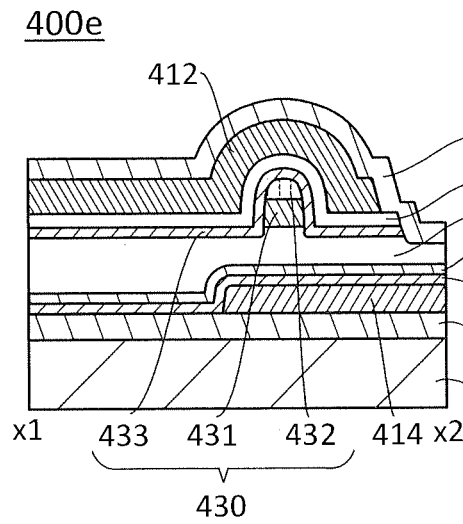
FIG. 13C is a cross-sectional view along the line x1-x2 in FIG. 13A.
Figure 13D:
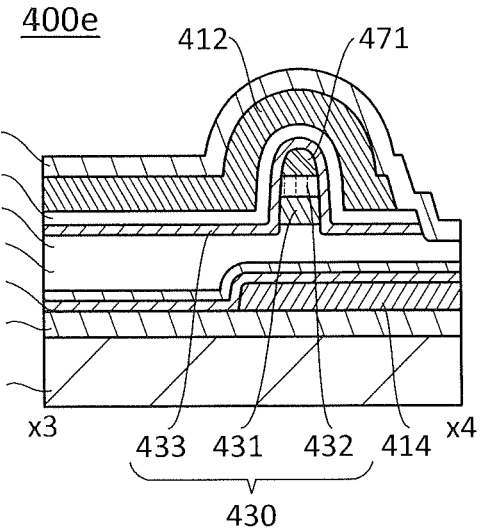
FIG. 13D is a cross-sectional view along the line x3-x4 in FIG. 13A.

FIGS. 13A to 13D illustrate a structure example of a transistor. FIG. 13A is a top view illustrating a transistor 400e. FIG. 13B is a cross-sectional view taken along the line y1-y2 in FIG. 13A. FIG. 13C is a cross-sectional view taken along the line x1-x2 in FIG. 13A. FIG. 13D is a cross-sectional view taken along the line x3-x4 in FIG. 13A.

The transistor 400e has the s-channel structure like the transistor 400a. The transistor 400e is provided with a conductive film 471 and a conductive film 472. The conductive films 471 and 472 function as source and drain electrodes. As in the transistor 400a, the gate electrode may be a stack of the conductive films 411 to 413.

The metal oxide 430 includes a portion where the metal oxides 431, 432, and 433 are stacked in this order. The conductive films 471 and 472 are provided over the stack formed of the metal oxides 431 and 432. The metal oxide 433 is formed to cover the metal oxides 431 and 432 and the conductive films 471 and 472. The insulating film 406 covers the metal oxide 433. Here, the metal oxide 433 and the insulating film 406 are etched using the same mask.

The conductive films 471 and 472 are formed of a hard mask used for forming the stack of the metal oxides 431 and 432. Thus, the conductive films 471 and 472 do not have regions in contact with the side surfaces of the metal oxides 431 and 432. For example, the metal oxides 431 and 432 and the conductive films 471 and 472 can be formed through the following steps. A two-layer oxide semiconductor film to be the metal oxides 431 and 432 is formed. A single-layer or multilayer conductive film is formed over the oxide semiconductor film. This conductive film is etched, so that a hard mask is formed. Using this hard mask, the two-layer oxide semiconductor film is etched to form the stack of the metal oxides 431 and 432. Then, the hard mask is etched to form the conductive films 471 and 472.

Embodiment 4

This embodiment will explain an electronic device with a structure where a Si transistor and an OS transistor are stacked. Here, an example of a structure of the electronic device in Embodiment 1 will be described.

Figure 14A:
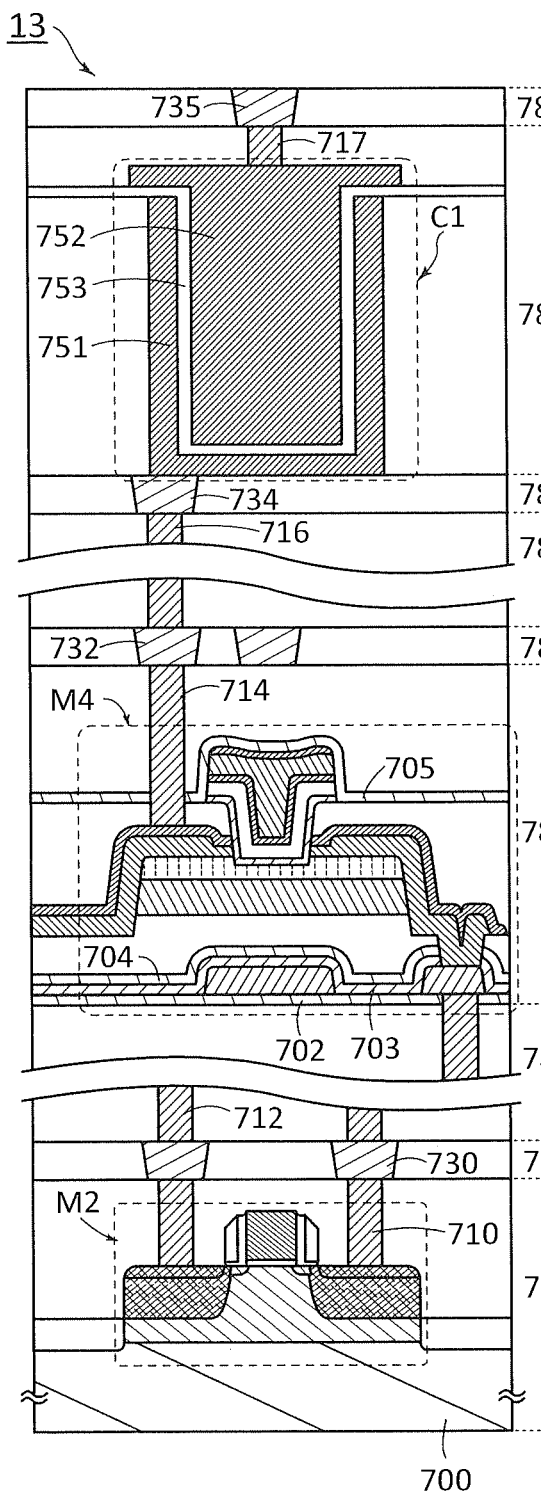
FIGS. 14A and 14B are cross-sectional views illustrating a structure example of an electronic device.
Figure 14B:
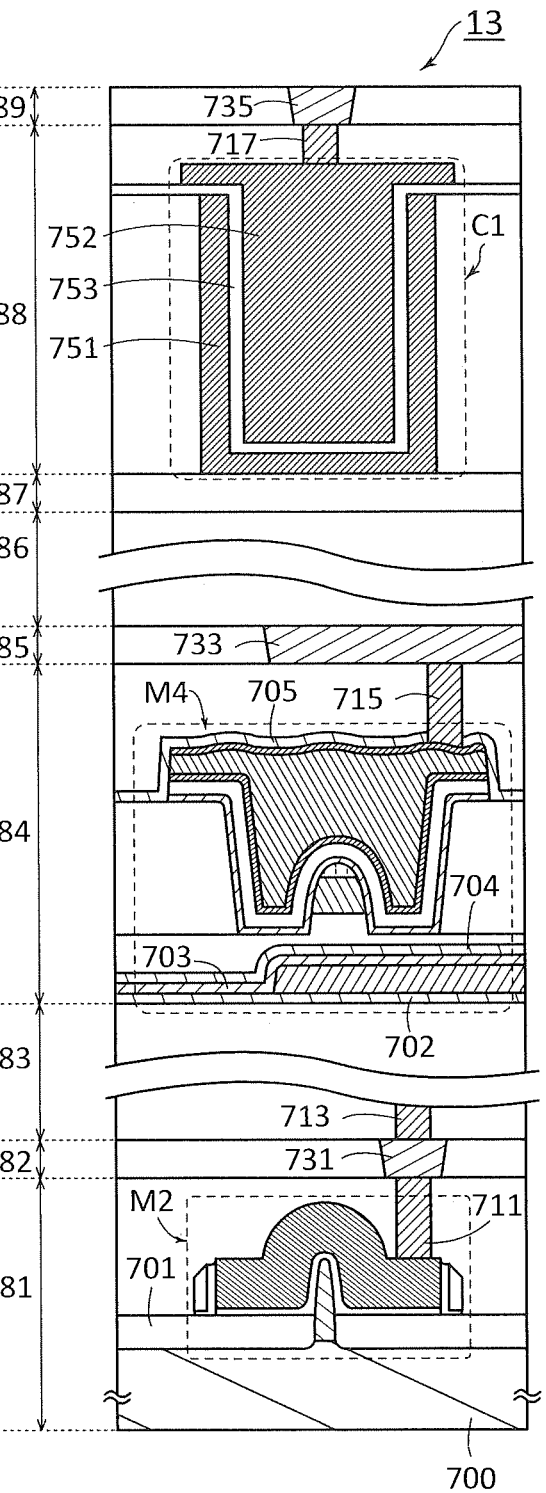

FIGS. 14A and 14B are cross-sectional views illustrating a structure of an electronic device and specifically show the circuit 13 (the transistors M2 and M4 and the capacitor C1). FIG. 14A is a cross-sectional view in the channel length direction of the transistors included in the electronic device 100. FIG. 14B is a cross-sectional view in the channel width direction of the transistors. Note that FIGS. 14A and 14B illustrate the structure of the electronic device 100, and the direction of the transistors included in the electronic device 100 is not limited to the direction shown in FIGS. 14A and 14B.

The electronic device 100 includes layers 781 to 789 from the bottom. The layer 781 includes a substrate 700, the transistor M2 formed using the substrate 700, an element isolation layer 701, and a plurality of plugs such as a plug 710 and a plug 711. The layer 781 is an element layer where Si transistors such as the transistor M2 are formed.

As the substrate 700, a single crystal semiconductor substrate or a polycrystalline semiconductor substrate of silicon or silicon carbide, a compound semiconductor substrate of silicon germanium, an SOI substrate, or the like can be used. Moreover, a glass substrate, a quartz substrate, a plastic substrate, a metal substrate, a flexible substrate, an attachment film, paper including a fibrous material, or a base film may be used as the substrate 700, for example. Alternatively, a semiconductor element may be formed using one substrate, and then transferred to another substrate. Here, as an example, a single crystal silicon wafer is used as the substrate 700.

Figure 15A:
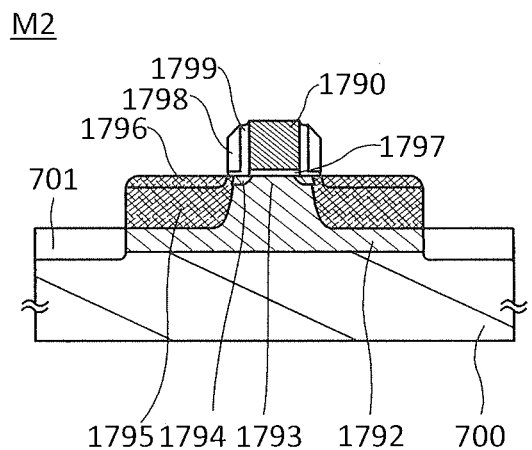
FIGS. 15A to 15D are cross-sectional views each illustrating a structure example of a transistor.
Figure 15B:
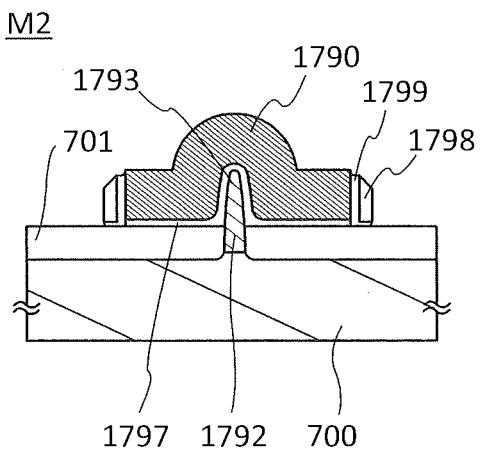

FIGS. 15A to 15D illustrate structure examples of the transistor M2. FIG. 15A is a cross-sectional view of the transistor M2 in the channel length direction, and FIG. 15B is a cross-sectional view of the transistor M2 in the channel width direction. The transistor M2 includes a channel formation region 1793 formed in a well 1792, low concentration impurity regions 1794 and high concentration impurity regions 1795 (also collectively referred to as impurity region simply), conductive regions 1796 provided in contact with the impurity region, a gate insulating film 1797 over the channel formation region 1793, a gate electrode 1790 over the gate insulating film 1797, and sidewall insulating layers 1798 and 1799 on side surfaces of the gate electrode 1790. Note that the conductive regions 1796 may be formed using metal silicide or the like.

In the transistor M2, the channel formation region 1793 has a protruding portion, and the gate insulating film 1797 and the gate electrode 1790 are provided along side and top surfaces of the channel formation region 1793. A transistor with such a device structure is referred to as a FIN transistor. Although the case where the protruding portion is formed by processing part of the substrate 700 is described here, a semiconductor layer having a protrusion may be formed by processing an SOI substrate.

Figure 15C:
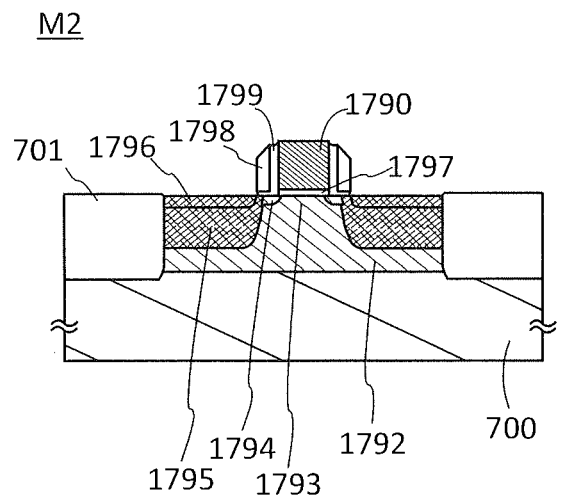
Figure 15D:
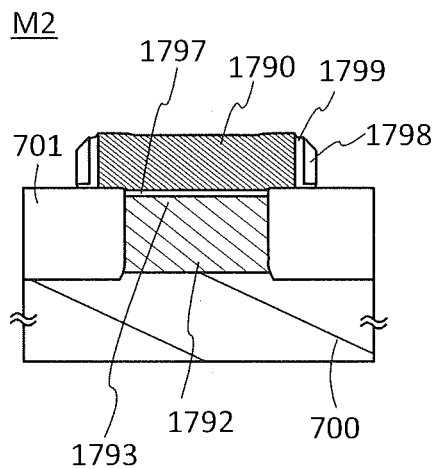

Note that the transistor M2 is not limited to a FIN transistor and may be a planar transistor as illustrated in FIGS. 15C and 15D, for example. FIG. 15C is a cross-sectional view of the transistor M2 in the channel length direction, and FIG. 15D is a cross-sectional view of the transistor M2 in the channel width direction.

The layer 782 includes a plurality of wirings such as a wiring 730 and a wiring 731. The layer 783 includes a plurality of plugs such as a plug 712 and a plug 713 and a plurality of wirings (not illustrated).

The layer 784 includes insulating films 702 to 705, the transistor M4, and a plurality of plugs such as a plug 714 and a plug 715. The layer 784 is an element layer where OS transistors such as the transistor M4 are formed. Here, the transistor M4 has the same device structure as the transistor 400c (FIGS. 11A to 11C).

The layer 785 includes a plurality of wirings such as a wiring 732 and a wiring 733. The layer 786 includes a plurality of plugs such as a plug 716 and a plurality of wirings (not illustrated). The layer 787 includes a plurality of wirings such as a wiring 734. The layer 788 includes the capacitor C1 and a plurality of plugs such as a plug 717. The layer 788 is an element layer where the capacitor C1 in the circuit 13 is formed. The capacitor C1 includes an electrode 751, an electrode 752, and an insulating film 753. The layer 789 includes a plurality of wirings such as a wiring 735.

The insulating films 704 and 705 preferably have an effect of blocking hydrogen, water, and the like. Water, hydrogen, and the like are factors that generate carriers in an oxide semiconductor; thus, providing such a blocking layer against hydrogen, water, and the like can improve the reliability of the transistor M4. Examples of an insulator having an effect of blocking hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 730 to 735 and the plugs 710 to 717 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material that has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 14A and 14B, regions without reference numerals and hatch patterns represent regions formed of an insulator. The insulator can be an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, these regions can be formed using a resin such as a polyimide resin, a polyamide resin, an acrylic resin, a siloxane resin, an epoxy resin, or a phenol resin.

Embodiment 5

In this embodiment, a structure of an oxide semiconductor will be described. An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor. From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example. In other words, a stable oxide semiconductor cannot be regarded as a completely amorphous oxide semiconductor, and an oxide semiconductor that is not isotropic (e.g., an oxide semiconductor that has a periodic structure in a microscopic region) cannot be regarded as a completely amorphous oxide semiconductor. Meanwhile, an a-like OS, which is not isotropic, has an unstable structure that contains a void. Because of its instability, an a-like OS is close to an amorphous oxide semiconductor in terms of physical properties.

<CAAC-OS>

A CAAC-OS is an oxide semiconductor having a plurality of c-axis-aligned crystal parts (also referred to as pellets).

(XRD)

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31°. This peak is derived from the (009) plane of the $InGaZnO_4$ crystal, which indicates that crystals in the CAAC-OS have c-axis alignment, and that the c-axes are aligned in a direction substantially perpendicular to a surface where the CAAC-OS film is formed (also referred to as formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Furthermore, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with 2θ fixed at around 56° and with the sample rotated using a normal vector of the sample surface as an axis (φ axis), a clear peak is not observed. When single crystal $InGaZnO_4$ is subjected to φ scan with 2θ fixed at around 56°, six peaks that are derived from crystal planes equivalent to the (110) plane are observed. Accordingly, the structural analysis using XRD shows that the directions of a-axes and b-axes are irregularly oriented in the CAAC-OS.

(Electronic Diffraction)

For example, when an electron beam with a probe diameter of 300 nm is incident on a CAAC-OS including an $InGaZnO_4$ crystal in a direction parallel to the formation surface of the CAAC-OS, a diffraction pattern (also referred to as selected-area electron diffraction pattern) appears sometimes. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. A ring-like diffraction pattern appears when an electron beam with a probe diameter of 300 nm is incident on the sample in a direction perpendicular to the sample surface. Thus, the electron diffraction using an electron beam with a probe diameter of 300 nm also indicates that the a-axes and b-axes of the crystal parts included in the CAAC-OS do not have regular orientation.

(High-Resolution TEM Image)

In a combined analysis image (also referred to as transmission electron microscope (TEM) image) of a bright-field image and a diffraction pattern of the CAAC-OS, which is obtained using a TEM, a plurality of crystal parts can be observed. However, even in the high-resolution TEM image, a boundary between crystal parts, that is, a grain boundary is not clearly observed in some cases. Thus, in the CAAC-OS, a reduction in electron mobility due to the grain boundary is less likely to occur. To observe a high-resolution TEM image, a spherical aberration corrector function is preferably used. Here, a high-resolution TEM image obtained with a spherical aberration corrector function is referred to as a Cs-corrected high-resolution TEM image.

From a high-resolution cross-sectional TEM image of the CAAC-OS observed from the direction substantially parallel to the sample surface, a crystal part that is a region where metal atoms are arranged in a layered manner can be identified. A crystal part with a size of 1 nm or more and a crystal part with a size of 3 nm or more are observed. Therefore, the crystal part can also be referred to as a nanocrystal (nc). Furthermore, the CAAC-OS can also be referred to as an oxide semiconductor including c-axis-aligned nanocrystals (CANC). A crystal part reflects unevenness of a formation surface or a top surface of the CAAC-OS, and is parallel to the formation surface or the top surface of the CAAC-OS.

Image processing on a Cs-corrected high-resolution plan-view TEM image of the CAAC-OS observed from a direction substantially perpendicular to the sample surface demonstrates that a crystal part has a hexagonal configuration. Note that the shape of the crystal part is not always a regular hexagon but is a non-regular hexagon in many cases. The image processing is performed as follows.

A Cs-corrected high-resolution plan-view TEM image is subjected to fast Fourier transform (FFT), so that an FFT image is obtained. Mask processing is performed such that a range of from 2.8 $nm^{-1}$ to 5.0 $nm^{-1}$ from the origin in the obtained FFT image remains. The FFT image subjected to mask processing undergoes inverse fast Fourier transform (IFFT) to obtain an image (FFT filtering image). Since the FFT filtering image is obtained by extracting a periodic component from a Cs-corrected high-resolution TEM image, it shows a lattice arrangement.

In the obtained FFT filtering image, a clear grain boundary is not observed. The reason why a distorted hexagonal crystal part exists is that distortion of a lattice arrangement suppresses formation of grain boundaries. This is probably because the CAAC-OS can tolerate distortion owing to a low density of the atomic arrangement in the a-b plane direction, an interatomic bond distance changed by substitution of a metal element, and the like.

As described above, the CAAC-OS has c-axis alignment, its crystal parts (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, generation of defects, or the like might decrease the crystallinity of an oxide semiconductor. This means that the CAAC-OS has negligible amounts of impurities and defects (e.g., oxygen vacancies).

Note that impurities mean an element other than the main components of the oxide semiconductor, such as hydrogen, carbon, silicon, and a transition metal element. For example, an element (specifically, silicon or the like) having higher strength of bonding to oxygen than a metal element contained in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For another example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<nc-OS>
(XRD)

When the structure of an nc-OS is analyzed by an out-of-plane method, a peak indicating orientation does not appear. That is, a crystal of an nc-OS does not have orientation. For example, when an electron beam with a probe diameter of 50 nm is incident on a 34-nm-thick region of a thinned nc-OS including an $InGaZnO_4$ crystal in a direction parallel to the formation surface, a ring-shaped diffraction pattern is observed. When an electron beam with a probe diameter of 1 nm is incident on the same sample, a plurality of spots are observed in the ring-shaped region. In other words, ordering in an nc-OS is not observed with an electron beam having a probe diameter of 50 nm but is observed with an electron beam having a probe diameter of 1 nm.

When an electron beam with a probe diameter of 1 nm is incident on a region with a thickness of less than 10 nm, an electron diffraction pattern in which spots are arranged in an approximately hexagonal shape is observed in some cases. This means that an nc-OS has a well-ordered region, i.e., a crystal, in the thickness range of less than 10 nm. Note that an electron diffraction pattern having regularity is not observed in some regions because crystals are aligned in various directions.

(High-Resolution TEM Image)

In a Cs-corrected high-resolution cross-sectional TEM image of the nc-OS, a region where a crystal part is observed and a region where a clear crystal part is not observed are identified. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image, a grain boundary of the nc-OS is not clearly observed in some cases. Note that there is a possibility that the origin of the nanocrystal is the same as that of a crystal part in a CAAC-OS. Therefore, a crystal part of the nc-OS may be referred to as a pellet.

As described above, in the nc-OS, a microscopic region (e.g., a region with a size greater than or equal to 1 nm and less than or equal to 10 nm, and in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, the nc-OS cannot be distinguished from an a-like OS or an amorphous oxide semiconductor by some analysis methods. Since there is no regularity of crystal orientation between the crystal parts (nanocrystals), the nc-OS can also be referred to as an oxide semiconductor including randomly aligned nanocrystals (RANC) or an oxide semiconductor including non-aligned nanocrystals (NANC).

The structure of the nc-OS has higher regularity than that of an amorphous oxide semiconductor. Thus, the nc-OS has a lower density of defect states than an a-like OS and an amorphous oxide semiconductor. Since there is no regularity of crystal orientation between different crystal parts in the nc-OS, the nc-OS has a higher density of defect states than the CAAC-OS.

<a-like OS>

An a-like OS has a structure between those of the nc-OS and an amorphous oxide semiconductor. For example, the structure of the a-like OS has lower regularity than that of the nc-OS but has higher regularity than that of an amorphous oxide semiconductor. The a-like OS has an unstable structure, compared to the nc-OS and the CAAC-OS. The a-like OS has lower density than the nc-OS and the CAAC-OS. This is because the a-like OS has a void (low-density region). A void is observed in a high-resolution cross-sectional TEM image.

The density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, the density of single crystal $InGaZnO_4$ with a rhombohedral crystal structure is 6.357 $g/cm^3$. Accordingly, in the case of an oxide semiconductor having an atomic ratio of In:Ga:Zn=1:1:1, the density of the a-like OS is higher than or equal to 5.0 $g/cm^3$ and lower than 5.9 $g/cm^3$ and the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. For example, a weighted average of the density of single crystals with different compositions can be calculated on the basis of the combination ratio of these single crystals. Note that it is preferable to combine as few kinds of single crystals as possible for density calculation.

As described above, oxide semiconductors have various structures and various properties. For example, an oxide semiconductor film used for a semiconductor device such as an OS transistor may be a single-layer film formed of a CAAC-OS, an nc-OS, an a-like OS, or an amorphous oxide semiconductor or a stacked film using oxide semiconductors with different structures.

Information about this specification and the like is described below. In this specification and the like, ordinal numbers such as "first," "second," and "third" are used to show the order in some cases. Furthermore, ordinal numbers are sometimes used to avoid confusion among components, and do not limit the number or order of components. For example, it is possible to replace the term "first" with the term "second" or "third" in describing one embodiment of the present invention.

Note that in this specification, terms for describing arrangement, such as "over" and "under", are sometimes used for convenience to describe a positional relation between components with reference to drawings. The positional relation between components is changed as appropriate in accordance with a direction in which each component is described. Thus, there is no limitation on terms used in this specification, and description can be made appropriately depending on the situation.

Note that in this specification and the like, the terms "film" and "layer" can be interchanged depending on the case or circumstances. For example, in some cases, the term "conductive film" can be used instead of the term "conductive layer," and the term "insulating layer" can be used instead of the term "insulating film."

A voltage usually refers to a potential difference between a given potential and a reference potential (e.g., a ground potential or a source potential). A voltage can therefore be referred to as a potential. Note that a potential has a relative value. Accordingly, a ground potential (GND) does not necessarily mean 0 V.

In the drawings, the size, the layer thickness, or the region is exaggerated for clarity in some cases. Therefore, the scale is not necessarily limited to that illustrated in the drawings. Note that the drawings are schematic views showing ideal examples, and shapes or values are not limited to those illustrated in the drawings. For example, the following can be included: variation in signal, voltage, or current due to noise or difference in timing.

In this specification and the like, the term "parallel" indicates that the angle formed between two straight lines ranges from $-10°$ to $10°$, and accordingly also includes the case where the angle ranges from $-5°$ to $5°$. The term "substantially parallel" indicates that the angle formed between two straight lines ranges from $-30°$ to $30°$. The term "perpendicular" indicates that the angle formed between two straight lines ranges from $80°$ to $100°$, and accordingly also includes the case where the angle ranges from $85°$ to $95°$. The term "substantially perpendicular" indicates that the angle formed between two straight lines ranges from $60°$ to $120°$.

In this specification and the like, the trigonal and rhombohedral crystal systems are included in the hexagonal crystal system.

This application is based on Japanese Patent Application serial no. 2015-103331 filed with Japan Patent Office on May 21, 2015, the entire contents of which are hereby incorporated by reference.

What is claimed is:

1. An electronic device comprising:
a first circuit, a second circuit, a third circuit, and a fourth circuit,
wherein a first weight from a first wiring as a first signal is input to the first circuit,
wherein the first circuit is configured to hold the first weight based on the first signal which is input from the first wiring,
wherein a first input value from a third wiring as an analog voltage signal is input to the first circuit,
wherein the first circuit is configured to output a first operation result based on the first input value and the first weight, to a fourth wiring,
wherein a second weight from a second wiring as a second signal is input to the second circuit,
wherein the second circuit is configured to hold the second weight based on the second signal which is input from the second wiring,
wherein the first input value from the third wiring is input to the second circuit,
wherein the second circuit is configured to output a second operation result based on the first input value and the second weight, to a fifth wiring,
wherein a third weight from the first wiring as a third signal is input to the third circuit,
wherein the third circuit is configured to hold the third weight based on the third signal which is input from the first wiring,
wherein a second input value from a sixth wiring as an analog voltage signal is input to the third circuit,
wherein the third circuit is configured to output a third operation result based on the second input value and the third weight, to the fourth wiring,
wherein a fourth weight from the second wiring as a fourth signal is input to the fourth circuit,
wherein the fourth circuit is configured to hold the fourth weight based on the fourth signal which is input from the second wiring,
wherein the second input value from the sixth wiring is input to the fourth circuit, and
wherein the fourth circuit is configured to output a fourth operation result based on the second input value and the fourth weight, to the fifth wiring.

2. An electronic component comprising the electronic device according to claim 1,
wherein the electronic component is used in digital signal processing, software-defined radio systems, avionic systems, application specific integrated circuit prototyping, medical image processing, sound recognition, encryption, bioinformatics, emulators for mechanical systems, radio telescopes in radio astronomy, or in-car electronic appliances.

3. A semiconductor package comprising the electronic device according to claim 1,
wherein the semiconductor package is used in digital signal processing, software-defined radio systems, avionic systems, application specific integrated circuit prototyping, medical image processing, sound recognition, encryption, bioinformatics, emulators for mechanical systems, radio telescopes in radio astronomy, or in-car electronic appliances.

4. An electronic device comprising:
a first circuit, a second circuit, a third circuit, and a fourth circuit,
wherein the first circuit comprises:
a first capacitor, one electrode of the first capacitor electrically connected to a first node, and the other electrode of the first capacitor electrically connected to a third wiring; and
a first transistor, wherein the second circuit comprises:
  a second capacitor, one electrode of the second capacitor electrically connected to a second node, and the other electrode of the second capacitor electrically connected to the third wiring; and
  a second transistor,
wherein the third circuit comprises:
  a third capacitor, one electrode of the third capacitor electrically connected to a third node, and the other electrode of the third capacitor electrically connected to a sixth wiring; and
  a third transistor,
wherein the fourth circuit comprises:
  a fourth capacitor, one electrode of the fourth capacitor electrically connected to a fourth node, and the other electrode of the fourth capacitor electrically connected to the sixth wiring; and
  a fourth transistor,
wherein a first weight from a first wiring as a first signal is input to the first transistor,
wherein the first transistor controls the first node which holds a potential corresponding to the first weight,
wherein a first input value from the third wiring as an analog voltage signal is input to the first circuit,
wherein the first circuit is configured to output a first operation result based on the first input value from the third wiring and the potential which is held by the first node, to a fourth wiring,
wherein a second weight from a second wiring as a second signal is input to the second transistor,
wherein the second transistor controls the second node which holds a potential corresponding to the second weight,
wherein the first input value from the third wiring is input to the second circuit,
wherein the second circuit is configured to output a second operation result based on the first input value from the third wiring and the potential which is held by the second node, to a fifth wiring,
wherein a third weight from the first wiring as a third signal is input to the third transistor,
wherein the third transistor controls the third node which holds a potential corresponding to the third weight,
wherein a second input value from the sixth wiring as an analog voltage signal is input to the third circuit,
wherein the third circuit is configured to output a third operation result based on the second input value from the sixth wiring and the potential which is held by the third node, to the fourth wiring,
wherein a fourth weight from the second wiring as a fourth signal is input to the fourth transistor,
wherein the fourth transistor controls the fourth node which holds a potential corresponding to the fourth weight,
wherein the second input value from the sixth wiring is input to the fourth circuit, and
wherein the fourth circuit is configured to output a fourth operation result based on the second input value from the sixth wiring and the potential which is held by the fourth node, to the fifth wiring.

5. An electronic component comprising the electronic device according to claim 4,
wherein the electronic component is used in digital signal processing, software-defined radio systems, avionic systems, application specific integrated circuit prototyping, medical image processing, sound recognition, encryption, bioinformatics, emulators for mechanical systems, radio telescopes in radio astronomy, or in-car electronic appliances.

6. A semiconductor package comprising the electronic device according to claim 4,
wherein the semiconductor package is used in digital signal processing, software-defined radio systems, avionic systems, application specific integrated circuit prototyping, medical image processing, sound recognition, encryption, bioinformatics, emulators for mechanical systems, radio telescopes in radio astronomy, or in-car electronic appliances.

* * * * *